United States Patent
Hayashi et al.

(10) Patent No.: US 9,829,519 B2
(45) Date of Patent: *Nov. 28, 2017

(54) METHOD AND APPARATUS TO COMMISSION VOLTAGE SENSORS AND BRANCH CIRCUIT CURRENT SENSORS FOR BRANCH CIRCUIT MONITORING SYSTEMS

(71) Applicant: EATON CORPORATION, Cleveland, OH (US)

(72) Inventors: Alan Kenji Hayashi, Avalon, PA (US); Brian Zachary Zaremski, Pittsburgh, PA (US); Zhi Gao, Warrendale, PA (US)

(73) Assignee: EATON CORPORATION, Cleveland, OH (US)

( * ) Notice: Subject to any disclaimer, the term of this patent is extended or adjusted under 35 U.S.C. 154(b) by 32 days.

This patent is subject to a terminal disclaimer.

(21) Appl. No.: 14/722,481

(22) Filed: May 27, 2015

(65) Prior Publication Data
US 2016/0349311 A1    Dec. 1, 2016

(51) Int. Cl.
*G01R 29/16* (2006.01)
*G01R 25/00* (2006.01)
*G01R 31/28* (2006.01)
*G01R 21/133* (2006.01)
*G01R 35/00* (2006.01)
*G01R 31/04* (2006.01)

(52) U.S. Cl.
CPC ........... *G01R 25/00* (2013.01); *G01R 21/133* (2013.01); *G01R 31/041* (2013.01); *G01R 31/2829* (2013.01); *G01R 35/005* (2013.01)

(58) Field of Classification Search
CPC   G01R 31/2829; G01R 35/005; G01R 21/133; G01R 25/00; G01R 25/005; G01R 29/16; G01R 29/18
USPC .................................................. 324/107, 537
See application file for complete search history.

(56) References Cited

U.S. PATENT DOCUMENTS

| 6,112,159 A | * | 8/2000 | Bond | G01R 21/1333 324/107 |
| 7,660,776 B1 | * | 2/2010 | Kious | G06N 5/025 706/45 |
| 2006/0238932 A1 | | 10/2006 | Westbrock, Jr. et al. | |
| 2012/0089354 A1 | | 4/2012 | Holdsclaw | |
| 2014/0333286 A1 | | 11/2014 | Wang et al. | |
| 2015/0042311 A1 | | 2/2015 | Gao et al. | |

OTHER PUBLICATIONS

European Patent Office, "International Search Report and Written Opinion" PCT/US2016/033400, dated Sep. 1, 2016, 12 pp.

* cited by examiner

*Primary Examiner* — Amy He
(74) *Attorney, Agent, or Firm* — Eckert Seamans; Philip Levy; Grant Coffield

(57) ABSTRACT

A system and method for a branch current monitoring system employing a 2-Phase Wye, a Single-Phase 3-Wire or a Single-Phase 2-Wire wiring configuration that is configured to identify a phase association and a polarity for a branch circuit current sensor using the phase angle between voltage and current. Also, a system and method for verifying phase association and polarity determinations for branch circuit current sensors that utilizes real and reactive power measurements.

12 Claims, 9 Drawing Sheets

METHOD AND APPARATUS TO COMMISSION VOLTAGE SENSORS AND BRANCH CIRCUIT CURRENT SENSORS FOR BRANCH CIRCUIT MONITORING SYSTEMS

BACKGROUND

Field

The disclosed concept relates generally to electric power or energy meters in polyphase electric power systems, and more particularly to the commissioning and diagnosis of voltage sensors and current sensors under different wiring configurations for branch circuit monitoring systems used in polyphase electric power systems.

Background Information

In a branch circuit monitoring system, a service panel typically has bus bars that have polyphase voltages that can be measured using voltage sensors. In addition, the panel also has multiple main current sensors on the bus bars. Furthermore, the service panel can have branches and associated branch circuit current sensors. For proper metering, it is critical that those voltage and current sensors be configured correctly. Incorrect configurations often involve voltage sensors wired to wrong phases, branch circuit current sensors associated with wrong phases, or branch circuit current sensors incorrectly grouped.

A conventional approach for commissioning and diagnosing a branch circuit monitoring system is based on an understanding of the physical layout of the system and the values measured by the voltage and current sensors, which values are used to calculate real, reactive, and apparent power values. Branch circuit current sensors are grouped based on the physical layout, which are used to calculate branch power. A failure in the understanding of the physical layout of the system often results in an incorrect configuration. Incorrect configurations may produce similar real, reactive, apparent, and branch power values.

SUMMARY

In one embodiment, a method for a branch current monitoring system employing a 2-Phase Wye, a Single-Phase 3-Wire or a Single-Phase 2-Wire wiring configuration is provided, wherein the branch current monitoring system has at least a first phase. The method includes obtaining a voltage measurement using a voltage sensor associated with the first phase, obtaining a current measurement using a branch circuit current sensor, wherein the branch circuit current sensor is intended to measure a phase current of the first phase, determining a phase angle between the voltage measurement and the current measurement, and using the phase angle and a set of rules including a plurality of predetermined rules to identify at least one phase association and at least one polarity for the branch circuit current sensor.

In another embodiment, a branch circuit meter module for a branch current monitoring system employing a 2-Phase Wye, a Single-Phase 3-Wire or a Single-Phase 2-Wire wiring configuration is provided, wherein the branch current monitoring system has at least a first phase. The branch circuit meter module includes a control system, wherein the control system stores and is structured to execute a number of routines. The number of routines are structured to receive a voltage measurement from a voltage sensor associated with the first phase, receive a current measurement from a branch circuit current sensor, wherein the branch circuit current sensor is intended to measure a phase current of the first phase, determine a phase angle between the voltage measurement and the current measurement, and use the phase angle and a set of rules including a plurality of predetermined rules to identify at least one phase association and at least one polarity for the branch circuit current sensor.

In another embodiment, a method for an electric power system having at least a first phase, a main current sensor structured to measure a main current of the first phase and a main voltage sensor structured to measure a main voltage of the first phase is provided. The method includes identifying that each of a plurality of branch circuit current sensors is associated with the first phase using a phase angle between a voltage measured by the main voltage sensor and a current measured by the branch circuit current sensor, and determining whether each of the plurality of branch circuit current sensors has been properly identified as being associated with the first phase by: determining a total branch real power quantity and a total branch reactive power quantity for the plurality of branch circuit current sensors using the voltage measured by the main voltage sensor and the current measured by the branch circuit current sensor; determining a total main real power quantity and a total main reactive power quantity for the first phase using measurements made by the main current sensor and the main voltage sensor; and comparing the total branch real power quantity to the total main real power quantity and the total branch reactive power quantity to the total main reactive power quantity.

In still another embodiment, a branch circuit meter module for an electric power system having at least a first phase, a main current sensor structured to measure a main current of the first phase and a main voltage sensor structured to measure a main voltage of the first phase is provided. The branch circuit meter module includes a control system, wherein the control system stores and is structured to execute a number of routines. The number of routines are structured to identify that each of a plurality of branch circuit current sensors is associated with the first phase using a phase angle between a voltage measured by the main voltage sensor and a current measured by the branch circuit current sensor; and determine whether each of the plurality of branch circuit current sensors has been properly identified as being associated with the first phase by: determining a total branch real power quantity and a total branch reactive power quantity for the plurality of branch circuit current sensors using the voltage measured by the main voltage sensor and the current measured by the branch circuit current sensor; determining a total main real power quantity and a total main reactive power quantity for the first phase using measurements made by the main current sensor and the main voltage sensor; and comparing the total branch real power quantity to the total main real power quantity and the total branch reactive power quantity to the total main reactive power quantity.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the term "processor" means a programmable analog and/or digital device that can store, retrieve, and process data; a computer; a workstation; a personal computer a digital signal processor, a microprocessor; a microcontroller; a microcomputer; a central processing unit; a controller; a mainframe computer; a minicomputer, a server; a networked processor, or any suitable processing device or apparatus.

In one aspect, the disclosed concept provides a method and apparatus that diagnoses current sensor polarities and phase associations in different wiring configurations for protective relays or electric power or energy meters in polyphase electric power systems. The method and apparatus monitors phase angles between voltage and current waveforms, and diagnoses polarity and phase associations of current sensors in different wiring configurations using the monitored phase angles. Voltages and currents are measured via voltage and current sensors, respectively, and the measured voltages and currents are converted into respective discrete-time voltage and current samples by analog-to-digital converters. A phase angle is calculated between the voltage and current for each phase, and the polarities and phase associations of the current sensors under different wiring configurations are diagnosed based on the phase angle. The diagnosis results are output to indicate the determined polarities and phase associations. The diagnosis results may be stored and may be used for troubleshooting or other diagnostic purposes In another aspect, the disclosed concept provides a method and apparatus for validating branch circuit current sensor diagnoses based on real and reactive power calculations. In still another aspect, the disclosed concept provides a method and apparatus for detecting the wiring configuration of an electric power system based upon a particular voltage ratio that is determined for the electric power system. In still a further aspect, the disclosed concept provides a method and apparatus for diagnosing voltage swap conditions in an electric power system. The particulars of each of these aspects of the disclosed concept according to various exemplary embodiments is described in detail herein.

Figure 1A:
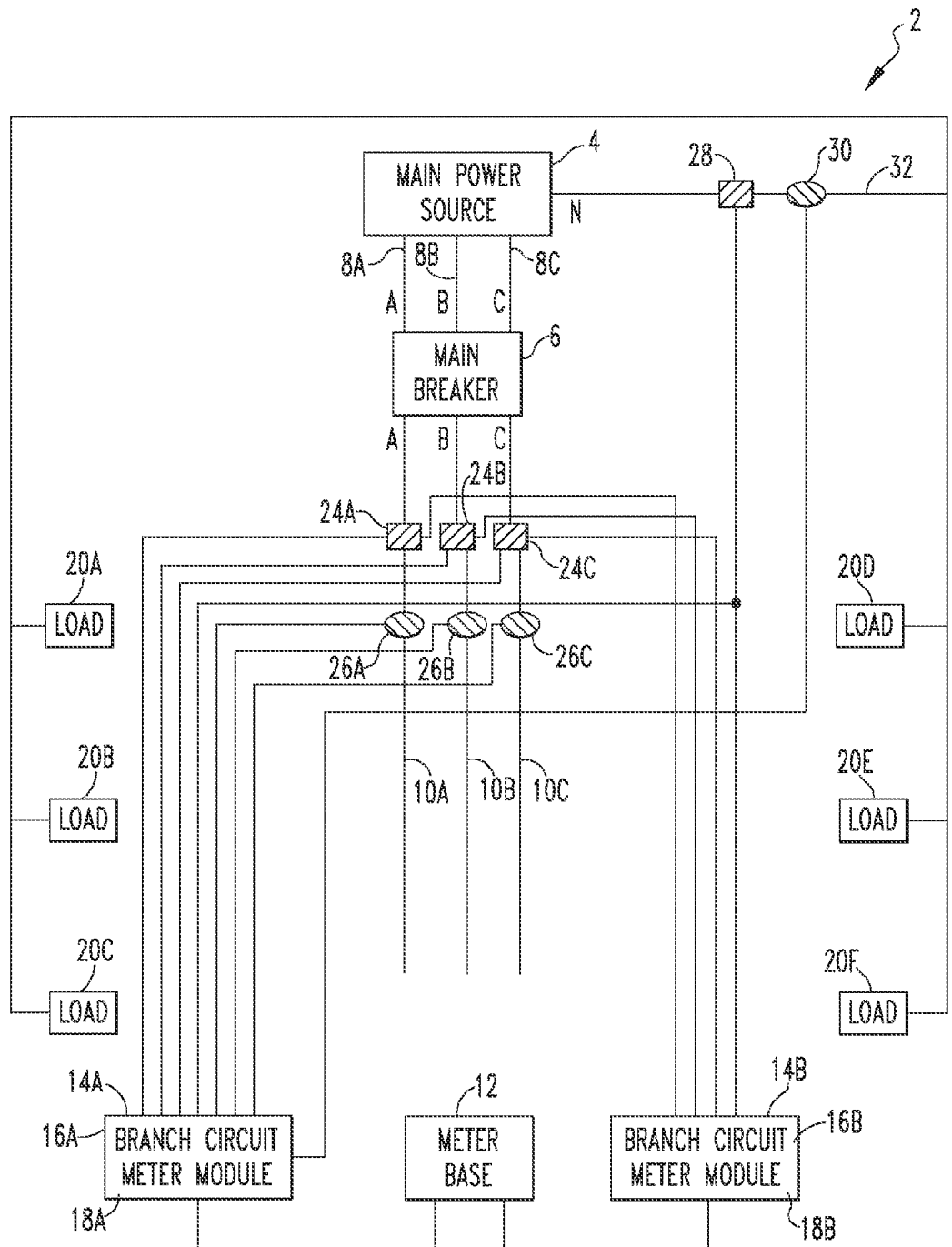
FIGS. 1A and 1B are a schematic diagram of a branch circuit monitoring system according to one non-limiting exemplary embodiment in which the disclosed concept may be implemented.
Figure 1B:
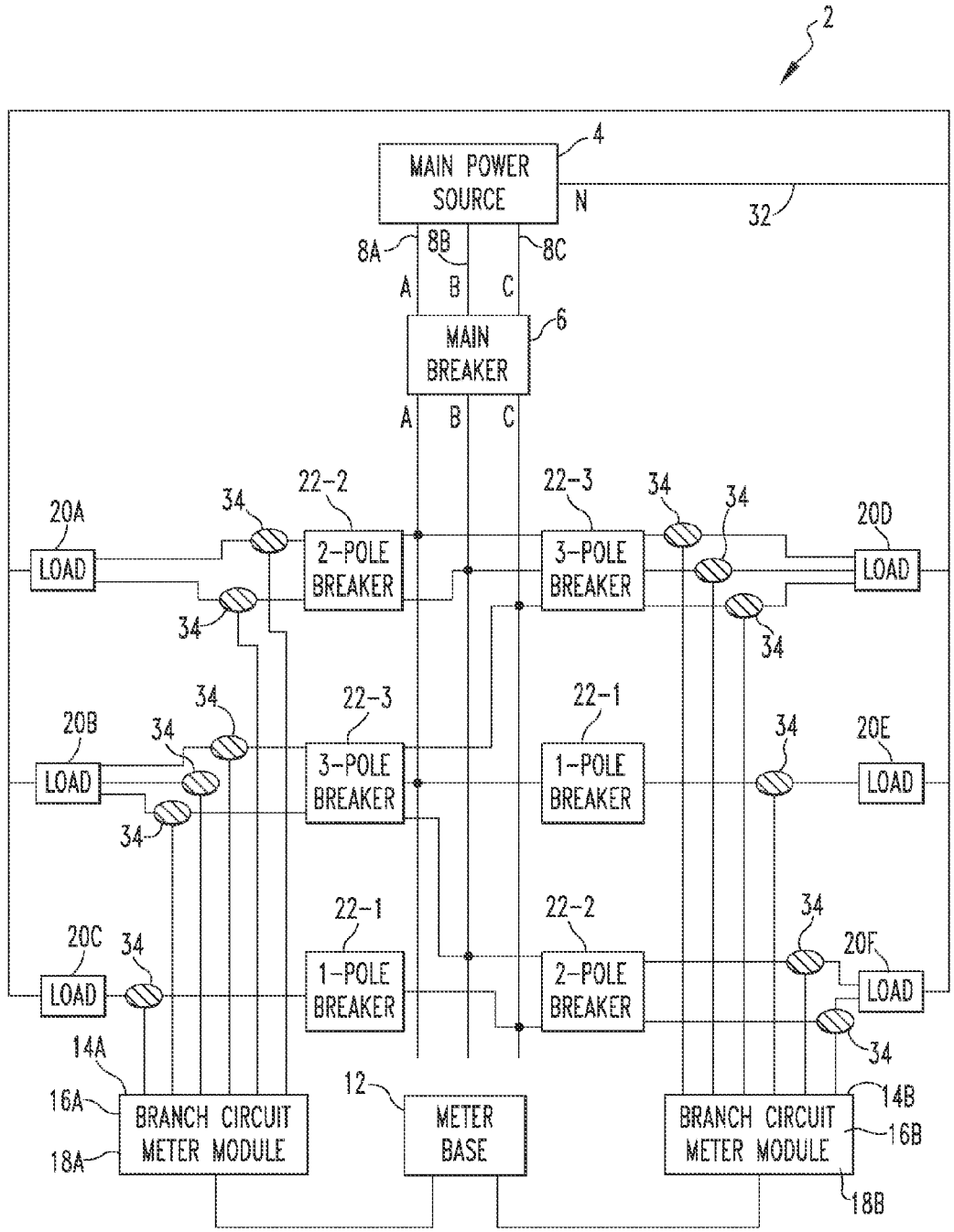

FIGS. 1A and 1B are a schematic diagram of a branch circuit monitoring system 2 according to one non-limiting exemplary embodiment in which the disclosed concept may be implemented. For ease of illustration, branch circuit monitoring system 2 is broken up between the two separate figures (FIGS. 1A and 1B), with FIG. 1A showing the wiring of the "Mains" and "Voltages" and FIG. 1B showing the branch circuit wiring configuration.

As seen in FIGS. 1A and 1B, branch circuit monitoring system 2 includes a main power source 4, such as, without limitation, a utility power source, which in the illustrated embodiment is a three phase AC power source. Main power source 4 provides phases A, B and C to a main breaker 6 via a busbar 8 having conductors 8A, 8B, and 8C. Main breaker 6 is a conventional 3-pole circuit breaker for providing circuit protection functionality to branch circuit monitoring system 2. The output of main breaker 6 is coupled to a busbar 10 having conductors 10A (which carries phase A), 10B (which carries phase B), and 10C (which carries phase C).

As seen in FIGS. 1A and 1B, branch circuit monitoring system 2 further includes a meter base 12 for providing power metering functionality for branch circuit monitoring system 2. First and second branch circuit meter modules 14A and 14B are coupled to meter base 12 as shown. Each branch circuit meter module 14 is structured to provide the functionality described briefly above and in greater detail herein. While in the illustrated embodiment branch circuit monitoring system 2 includes first and second branch circuit meter modules 14A and 14B as just described (each one associated with a particular group of branch circuits), it will be understood that this is exemplary only, and that the functionality of the two branch circuit meter modules 14 may be combined into a single branch circuit meter module 14. Furthermore, branch circuit monitoring system 2 also include more than 2 branch circuit meter modules 14, for example four, six or eight such modules.

In the exemplary embodiment, each branch circuit meter module 14A, 14B comprises a computing device having a control system including a processor 16A, 16B and a memory 18A, 18B. Processor 16A, 16B may be, for example and without limitation, a microprocessor (μP), a microcontroller, or some other suitable processing device, that interfaces with memory 18A, 18B. Memory 18A, 18B can be any one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. Memory 18A, 18B has stored therein a number of routines that are executable by processor 16. One or more of the routines implement (by way of computer/processor executable instructions) at least one embodiment of the methods discussed briefly above and in greater detail below for commissioning and diagnosing voltage and current sensors forming a part of branch circuit monitoring system 2 under different wiring configurations.

As seen in FIGS. 1A and 1B, branch circuit monitoring system 2 also includes a number of loads 20, labelled 20A-20F, which are powered by the power received from main power source 4. In particular, as seen in FIG. 1B, each load 20 is coupled to one or more of the conductors 10A, 10B, 10C of the main busbar 10 through an associated circuit breaker 22, which may be a 1-pole circuit breaker (labelled 22-1), a 2-pole circuit breaker (labelled 22-2) or a 3-pole (labelled 22-3) circuit breaker, as appropriate.

Referring to FIG. 1A, branch circuit monitoring system 2 also includes voltage sensors 24A, 24B, 24C for measuring the voltage of each phase on main busbar 10, and current sensors 26A, 26B, 26C for measuring the current of each phase on main busbar 10. Each voltage sensor 24 may be, for example and without limitation, a conventional potential transformer, and each current sensor 26 may be, for example and without limitation, a conventional current transformer. Branch circuit monitoring system 2 also includes a neutral voltage sensor 28 and a neutral current sensor 30 for measuring the voltage and current on a neutral line 32. The signals generated by the voltage sensors 24, the current sensors 26, the neutral voltage sensor 28 and the neutral current sensor 30 are provided to each branch circuit meter module 14 for use as described herein.

Referring to FIG. 1B, branch circuit monitoring system 2 includes a number of branch circuit current sensors 34, wherein, as seen in FIG. 1B, each branch circuit current sensor 34 is associated with: (i) a particular phase of main busbar 10, (ii) a particular pole of a particular one of the circuit breakers 22, and (iii) a particular load 20. Each branch circuit current sensor 34 may be, for example and without limitation, a conventional current transformer. The signals generated by the current sensors 34 are provided to one of the branch circuit meter modules 14 for use as described herein. In the non-limiting exemplary embodiment, the signals generated by the branch circuit current sensors 34 located on the left side of FIG. 1B and associated with the circuit breakers 22 on the left side of main busbar 10 are provided to branch circuit meter module 14A, and the signals generated by the branch circuit current sensors 34 located on the right side of FIG. 1B and associated with the circuit breakers 22 on the right side of main busbar 10 are provided to branch circuit meter module 14B.

In branch circuit monitoring system 2 as just described, the voltage and current sensors 24, 26, 28, 30 and 34 are operable to measure voltage and current waveforms, respectively. The voltage measurements are typically acquired by the voltage sensors either from a phase with respect to a separate phase, or from a phase with respect to a voltage reference point (e.g., neutral). In addition, there are two types of current sensors in branch circuit monitoring system 2. The first type of current sensor is the main current sensors 26, which are mounted on the conductors 10A, 10B, and 10C of main busbar 10 at an entry point to, for example, a service panel, and measure aggregate currents for each phase. The second type of current sensor is the branch circuit current sensors 34. Branch circuit current sensors 34 are mounted on each branch circuit associated with a respective load 20, and measure the current of the individual branch circuit.

In the exemplary embodiment, analog-to-digital converters 42, 44 described elsewhere herein (FIG. 8) are used to convert voltage and current measurements to discrete-time voltage and current samples, respectively, at a sampling frequency $f_S$. The sampling frequency $f_S$ is typically expressed in hertz (Hz), or samples per cycle. For example, given an electric power system with a utility frequency of $f_e$=60 Hz, a sampling frequency of 512 samples per cycle is equivalent to a sampling frequency of 30,720 Hz.

The voltage and current measurements described above are dependent on wiring configurations. For a branch circuit monitoring system 2 used in a 3-phase electric power system, the wiring configuration is typically one of the following possible cases: 3-Phase 4-Wire Wye; 3-Phase 3-Wire Delta; 3-Phase 4-Wire Delta; 3-Phase Corner-Grounded Delta; 2-Phase Wye; Single-Phase 3-Wire; and Single-Phase 2-Wire. For each wiring configuration, the voltage and current sensors 24, 26, 28, 30 and 34 are configured accordingly to provide voltage and current measurements.

Description of Various Wiring Configurations

The description provided below describes the voltage and current measurements that are associated with each particular wiring configuration listed above. That description will be helpful in understanding the particulars of the various aspects of the disclosed concept described elsewhere herein.

3-Phase 4-Wire Wye

Figure 2:
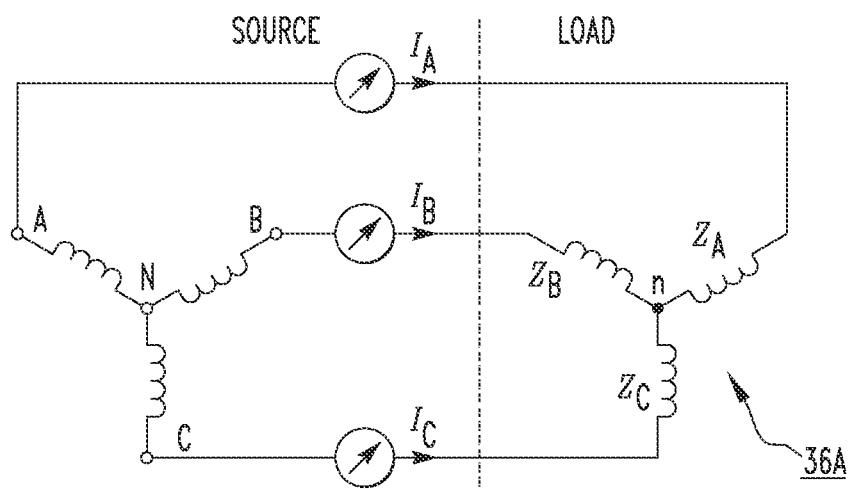
FIG. 2 is a circuit diagram of an exemplary 3-phase 4-wire Wye wiring configuration.

FIG. 2 is a circuit diagram 36A showing an exemplary 3-phase 4-wire Wye wiring configuration. In practice, the neutral N is connected to ground G through at least a resistor with high resistance to suppress over-voltages caused by re-striking arcs.

In the 3-phase 4-wire Wye wiring configuration, the voltage measurements are typically acquired by voltage sensors either from a phase with respect to a voltage reference point, or from a phase with respect to a separate phase. For instance, when voltage measurements are acquired by voltage sensors from a phase with respect to a voltage reference point in FIG. 2, a voltage sensor intended for voltage measurement $V_{AN}$ is configured to measure voltage from phase A to neutral N. A second voltage sensor intended for voltage measurement $V_{BN}$ is configured to measure voltage from phase B to neutral N. A third voltage sensor intended for voltage measurement $V_{CN}$ is configured to measure voltage from phase C to neutral N.

Alternatively, when voltage measurements are acquired by voltage sensors from a phase with respect to a separate phase in FIG. 2, a voltage sensor intended for voltage measurement $V_{AB}$ is configured to measure voltage from phase A to phase B. A second voltage sensor intended for voltage measurement $V_{BC}$ is configured to measure voltage from phase B to phase C. A third voltage sensor intended for voltage measurement $V_{CA}$ is configured to measure voltage from phase C to phase A.

It is worth noting that voltage measurements $V_{AB}$, $V_{BC}$, $V_{CA}$ are related to voltage measurements $V_{AN}$, $V_{BN}$, $V_{CN}$ via:

$$V_{AB}=V_{AN}-V_{BN} \qquad (1)$$

$$V_{BC}=V_{BN}-V_{CN} \qquad (2)$$

$$V_{CA}=V_{CN}-V_{AN}. \qquad (3)$$

In FIG. 2, the positive direction of the phase A current measurement $I_A$ is defined as from node "A" to node "n", and the voltage $V_{An}$ is defined as the voltage at node "A" with respect to the voltage at node "n" in the same figure. Likewise, similar definitions apply to phases B and C quantities $I_B$, $I_C$, and $V_{Bn}$, $V_{Cn}$.

3-Phase 3-Wire Delta

Figure 3:
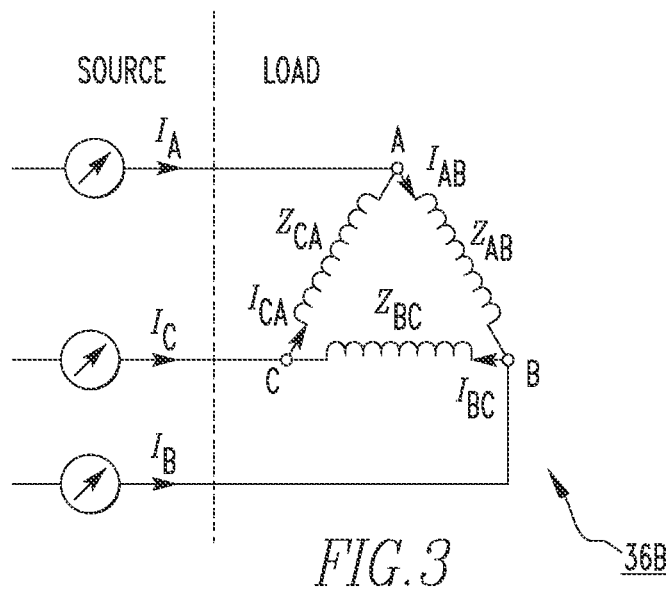
FIG. 3 is a circuit diagram of an exemplary 3-phase 3-wire Delta wiring configuration.

FIG. 3 is a circuit diagram 36B showing an exemplary 3-phase 3-wire Delta wiring configuration. The voltage $V_{AB}$ is defined as the voltage at node "A" with respect to the voltage at node "B," and the current $I_{AB}$ is defined as the current flowing from node "A" to node "B." Likewise, similar definitions apply to voltages $V_{BC}$, $V_{CA}$, and currents $I_{BC}$, $I_{CA}$.

In FIG., the positive direction of phase A current measurement $I_A$ is defined as from source to node "A". Likewise, similar definitions apply to phases B and C quantities $I_B$ and $I_C$.

3-Phase 4-Wire Delta

Figure 4:
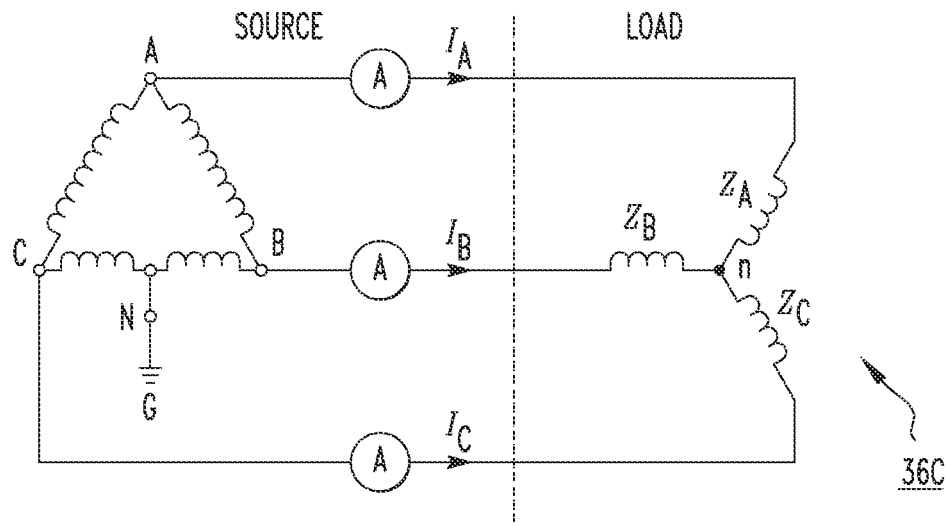
FIG. 4 is a circuit diagram of an exemplary 3-phase 4-wire Delta wiring configuration.

FIG. 4 is a circuit diagram 36C showing an exemplary 3-phase 4-wire Delta wiring configuration. This is also known as high-leg Delta wiring configuration. In practice, the node "N" in a 3-phase 4-wire Delta system is usually accessible, while the node "n" in the same 3-phase 4-wire Delta system is not always provided. Consequently, voltage measurements $V_{AN}$, $V_{BN}$, $V_{CN}$, and current measurements $I_A$, $I_B$, $I_C$ are available, while voltages $V_{An}$, $V_{Bn}$, $V_{Cn}$ are typically not available.

3-Phase Corner-Grounded Delta

Figure 5:
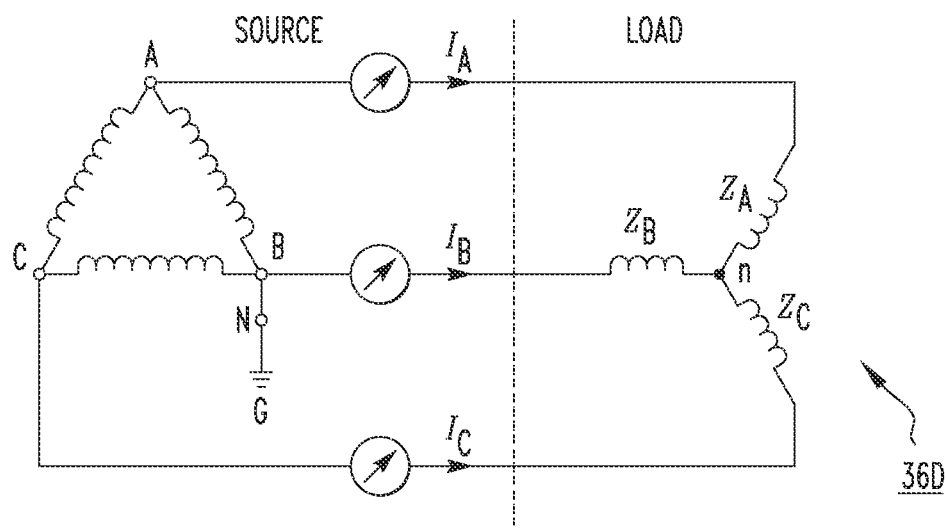
FIG. 5 is a circuit diagram of an exemplary 3-phase corner-grounded Delta wiring configuration.

FIG. 5 is a circuit diagram 36D showing 36C an exemplary 3-phase corner-grounded Delta wiring configuration. In practice, the node "N" in a 3-phase corner-ground Delta system usually is accessible, while the node "n" in the same 3-phase corner-ground Delta system is not always provided. Consequently, voltage measurements $V_{AN}$, $V_{CN}$, and current measurements $I_A$, $I_C$ are available, while voltages $V_{An}$, $V_{Bn}$, $V_{Cn}$ are typically not available.

2-Phase Wye

Figure 6:
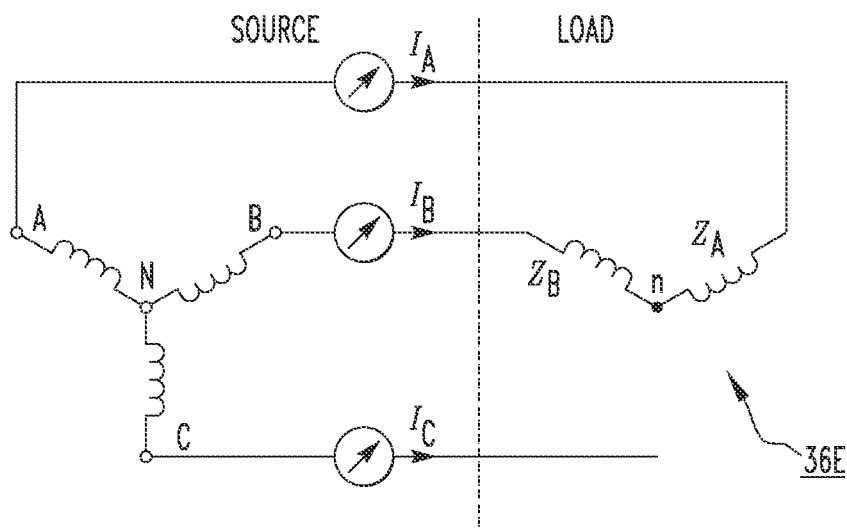
FIG. 6 is a circuit diagram of an exemplary 2-phase Wye wiring configuration.

The 2-phase Wye wiring configuration is a special case of the 3-phase 4-wire Wye wiring configuration. In a 2-phase Wye system, only 2 out of 3 phases are used. For example, FIG. 6 is a circuit diagram 36E showing an exemplary 2-phase Wye wiring configuration with only $Z_A$ and $Z_B$ connected at load side. In practice, the neutral N is connected to ground G through at least a resistor with high resistance to suppress over-voltages caused by re-striking arcs.

Single-Phase 3-Wire

Figure 7:
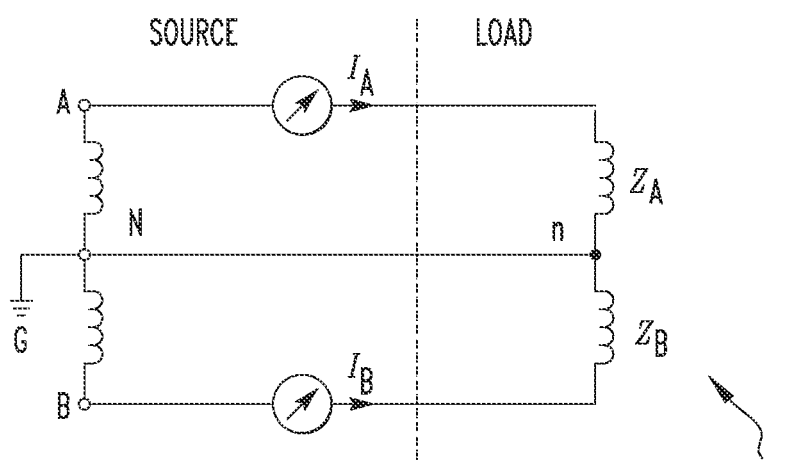
FIG. 7 is a circuit diagram of an exemplary single-phase 3-wire wiring configuration.

FIG. 7 is a circuit diagram 36F showing an exemplary single-phase 3-wire wiring configuration. This is also known as split-phase wiring configuration. Unlike 3-phase wiring configurations, nodes "A", "B" and "N" are all outputs from a center-tapped transformer, with neutral node "N" typically grounded.

According to FIG. 7, given balanced transformer outputs, voltages measurements $V_{AN}$ and $V_{BN}$ have the following relationship:

$$V_{AN} = -V_{BN}. \tag{4}$$

Single-Phase 2-Wire

The single-phase 2-wire wiring configuration is a special case of the single-phase 3-wire wiring configuration. In a single-phase 2-wire system, only 1 out of 2 phases are used. For example, referring to 7, when only $Z_A$ is connected, then the original single-phase 3-wire Wye system becomes a single-phase 2-wire system.

Branch Circuit Current Sensor Diagnosis

One particular aspect of the disclosed concept provides a branch circuit current sensor diagnosis methodology that determines whether a branch circuit current sensor has been configured with a correct polarity and associated with a correct phase. The branch circuit current sensor diagnosis of the disclosed concept, described in greater detail below, first obtains wiring configuration information, and then uses the phase angle between voltage and current to determine the current sensor's configuration.

In connection with implementing this aspect of the disclosed concept, a number of methods for calculating phase angle between voltage and current are provided. Also provided are diagnosis methods to determine whether a branch circuit current sensor has been configured with a correct polarity and associated with a correct phase which are particular to each wiring configuration.

Figure 8:
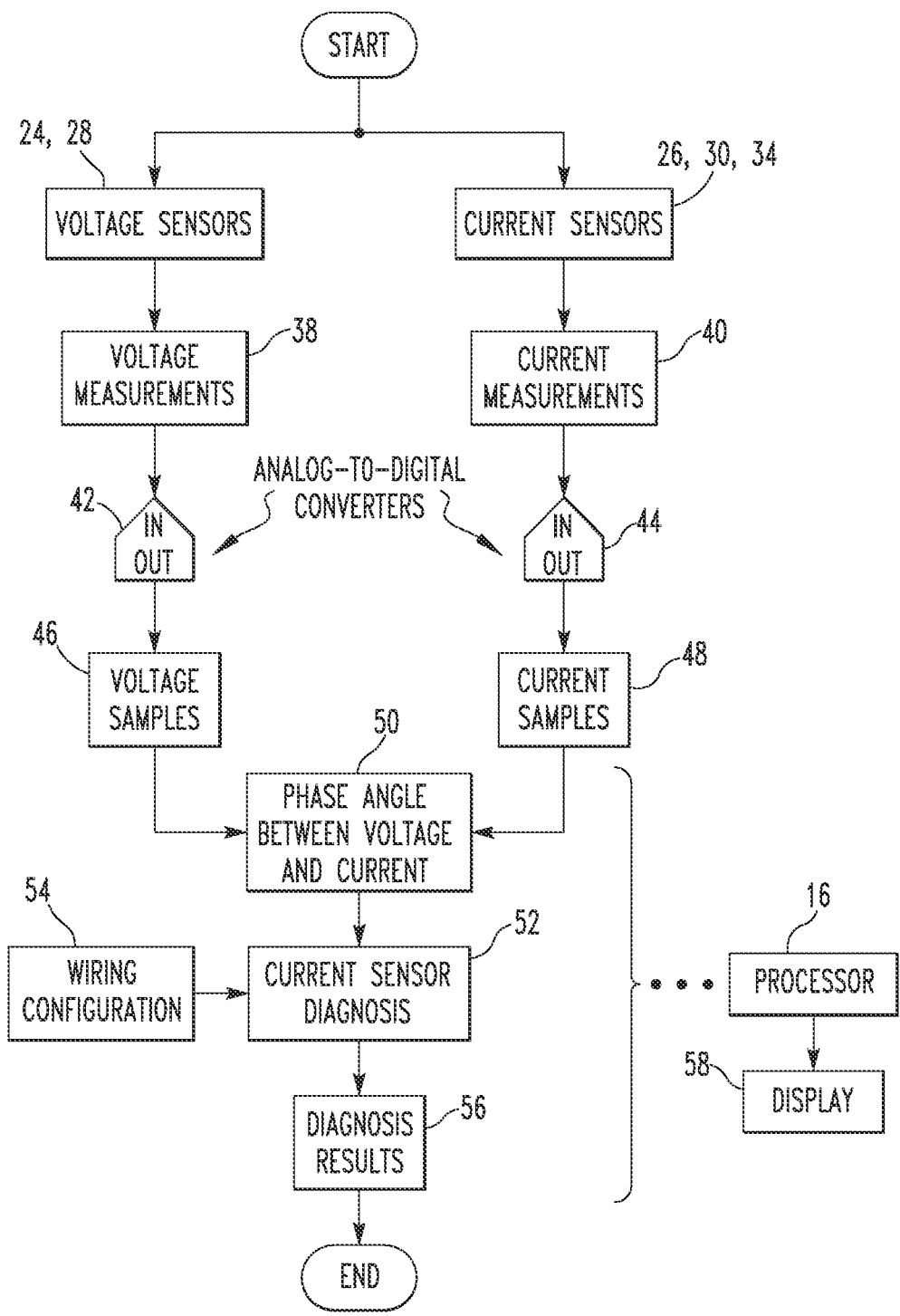
FIG. 8 is a schematic diagram of an overall architecture of a method and apparatus for current sensor diagnosis according to an exemplary embodiment as implemented by/in the branch circuit monitoring system of FIGS. 1A and 1B.

FIG. 8 shows an overall architecture of a method and apparatus of current sensor diagnosis according to an exemplary embodiment as implemented by/in branch circuit monitoring system 2 including branch circuit meter modules 14. The method and apparatus includes the following five parts or stages: (1) voltage and current measurements 38 and 40 are sensed by voltage sensors 24, 28 and current sensors 26, 30, 34, respectively; (2) the voltage and current measurements 38 and 40 are converted to respective voltage and current samples 46, 48 by analog-to-digital converters (ADCs) 42, 44; (3) a phase angle 50 between the voltage and current is typically calculated for phases A, B and C; (4) current sensor polarities and phase associations diagnoses 52 are determined based on predetermined wiring configurations 54 (see description provided elsewhere herein for a methodology for automatically determining the wiring configurations 54 according to a further aspect of the disclosed concept); and (5) diagnosis results 56 are output, and may be stored and may be used for troubleshooting or other diagnostic purposes. A suitable processor 16 forming a part of each branch circuit meter modules 14 as described herein is employed for the last three parts or stages 50, 52, 56. The processor 16 can be coupled to an example display 58 for the output of the diagnosis results 56. Although two ADCs 42, 44 are shown, a single ADC can be employed having a plurality of channels for outputting digital samples of the sensed voltages and currents.

As just described, the branch circuit current sensor diagnosis methodology of the disclosed concept determines whether a branch circuit current sensor 34 has been configured with a correct polarity and associated with a correct phase. In particular, the methodology first obtains wiring configuration information, and then uses the phase angle between voltage and current to determine the current sensor's configuration. Described below are two alternative methods that may be used to calculate phase angle between voltage and current in order to implement the branch circuit current sensor diagnosis methodology of the disclosed concept.

In a first method, for each phase, such as phase A, B, or C shown in FIGS. 1A and 1B, the phase angle between voltage and current may be calculated by counting the numbers of samples $N_Z$ from the voltage sample's zero-crossing time to the current sample's zero-crossing time. Because the sampling frequency $f_S$ is a known quantity, the number of samples from the voltage sample's zero-crossing time to the current sample's zero-crossing time may be converted to a time quantity $T_Z$ (in seconds) via:

$$T_Z = N_Z / f_S. \tag{5}$$

where $f_S$ is in hertz (Hz).

Because the utility frequency $f_e$ (in hertz) of the 3-phase electric power system is typically a known quantity, the time quantity $T_Z$ is further converted to a phase angle between voltage and current, typically expressed in degrees (°) via:

$$\phi = \text{rem}(360 \cdot T_Z \cdot f_e, 360) \quad (6)$$

where rem(·, 360) denotes the remainder of a quantity after it is divided by 360.

The operation wraps the phase angle between voltage and current to a non-negative value between 0 and 360°, and simplifies the subsequent current sensor diagnosis.

Following the above definition, when the voltage and current waveforms are in phase with each other, then the voltage and current samples' zero-crossing times are identical. Consequently, the phase angle between voltage and current is 0°. Otherwise, the phase angle between voltage and current is a positive value less than 360°.

In a second method, when real power P (in watts), apparent power S (in volts-amperes), and leading/lagging information of each phase are available, the phase angle between voltage and current for each phase is calculated by first calculating an intermediate phase angle $\phi'$ using Table 1 below.

TABLE 1

Method to Calculate Phase Angle

| P | S | Lead/Lag | $\phi' =$ |
|---|---|---|---|
| >0 | ≠0 | Lagging | arccos(P/S) |
| <0 | ≠0 | Lagging | arccos(P/S) |
| <0 | ≠0 | Leading | −arccos(P/S) |
| >0 | ≠0 | Leading | −arccos(P/S) |
| =0 | ≠0 | Lagging | π/2 |
| =0 | ≠0 | Leading | −π/2 |
| =0 | =0 | Undefined | Undefined |

In Table 1, arccos(·) is an arccosine function whose range is between 0 and π inclusive, i.e., 0≤arccos(·)≤π. For example, if P<0 and leading, then $\phi'=-\arccos(P/S)$.

The phase angle between voltage and current is then obtained from the intermediate phase angle $\phi'$ via:

$$\phi = \text{rem}[(\phi' + 2\pi) \cdot 180/\pi, 360]. \quad (7)$$

Moreover, as described in detail below, according to a further aspect of the disclosed concept, each different wiring configuration described herein has an associated set of rules for determining whether a branch circuit current sensor in the wiring configuration has been configured with a correct polarity and associated with a correct phase that uses the determined phase angle for the sensor in question.

More specifically, for a branch circuit current sensor 34 intended to measure phase A current in a 3-phase 4-wire Wye wiring configuration, there are 6 possible scenarios for this particular branch circuit current sensor 34:

1) The branch circuit current sensor 34 is wired to phase A current-carrying conductor with a normal polarity. Consequently, the current measurement from the branch circuit current sensor is $I_A$.
2) The branch circuit current sensor 34 is wired to phase A current-carrying conductor with a flipped polarity. Consequently, the current measurement from the branch circuit current sensor is $-I_A$.
3) The branch circuit current sensor 34 is wired to phase B current-carrying conductor with a normal polarity. Consequently, the current measurement from the branch circuit current sensor is $I_B$.
4) The branch circuit current sensor 34 is wired to phase B current-carrying conductor with a flipped polarity. Consequently, the current measurement from the branch circuit current sensor is $-I_B$.
5) The branch circuit current sensor 34 is wired to phase C current-carrying conductor with a normal polarity. Consequently, the current measurement from the branch circuit current sensor is $I_C$.
6) The branch circuit current sensor 34 is wired to phase C current-carrying conductor with a flipped polarity. Consequently, the current measurement from the branch circuit current sensor is $-I_C$.

Similarly, a branch circuit current sensor 34 intended to measure phase B or C current also has 6 possible scenarios in each case. According to the disclosed concept, and as described in greater detail below, the branch circuit current sensor diagnosis methodology determines which scenario a particular branch circuit current sensor 34 has by analyzing the phase angle between voltage and current according to a set of rules (in the form of a look-up table in the exemplary embodiment) that is specific to the particular wiring configuration in question, wherein the rules relate the phase angle to a particular sensor association and polarity.

In connection with the disclosed concept, all voltage sensors 24, 28 are assumed to have been correctly configured in polarities and phase associations. For instance, in the 3-phase 4-wire Wye wiring configuration example above, a voltage sensor 24 intended for voltage measurement $V_{AN}$ is configured correctly to measure voltage from phase A to neutral N. A second voltage sensor 24 intended for voltage measurement $V_{BN}$ is configured correctly to measure voltage from phase B to neutral N. A third voltage sensor 24 intended for voltage measurement $V_{CN}$ is configured correctly to measure voltage from phase C to neutral N.

In addition, because most modern 3-phase electric power systems are regulated, 3-phase voltages are hence assumed to be balanced, i.e., the voltage measurements $V_{AN}$, $V_{BN}$, $V_{CN}$, when expressed in phasors, have the same amplitude, and are 1200 degrees apart from each other.

Figure 9:
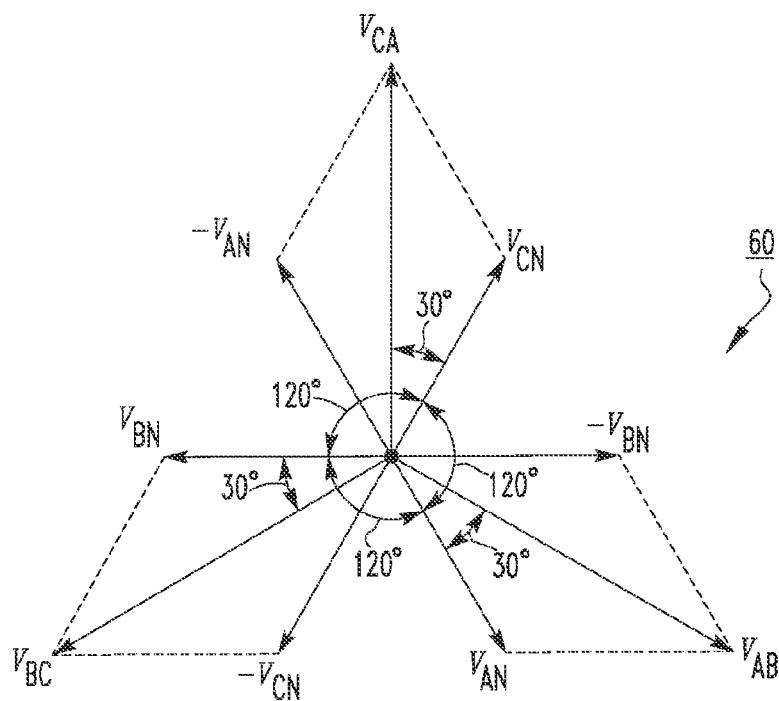
FIG. 9 is a phasor diagram of $V_{AN}$, $V_{BN}$, $V_{CN}$ and $V_{AB}$, $V_{AC}$, $V_{CA}$ in a 3-phase power system with balanced 3-phase voltages.

Consequently, according to equations (1)-(3), voltage measurements $V_{AB}$, $V_{BC}$, $V_{CA}$, when expressed in phasors, all have the same amplitude, and are 120° degrees apart from each other, as shown in phasor diagram 60 of FIG. 9.

For the purpose of the disclosed concept, a 3-phase symmetric load is assumed, i.e.:

$$Z_A = Z_B = Z_C = Z, \quad (8)$$

and the load impedance phase angle, $\phi$, is limited to between 10° leading (capacitive load) and 50° lagging (inductive load). If the load impedance phase angle, $\phi$, is expressed as a non-negative value between 0 and 360°, then the above limit translates to 0°≤$\phi$<50° and 350°<$\phi$<360°.

The above load impedance phase angle range includes: 1) purely resistive loads, in which the load impedance phase angle is $\phi$=0°; 2) a major portion of inductive loads, including induction motors, in which the load impedance has a lagging phase angle, i.e., 0°<$\phi$<50°; and 3) certain capacitive loads, in which the load impedance has a leading phase angle, i.e., 350°<$\phi$<360°.

While the above assumption limits the load impedance phase angle $\phi$ to a range 0°≤$\phi$<50° and 350°<$\phi$<360°, other load impedance phase angle ranges can be alternatively used. For example, in a system predominated by inductive loads, the load impedance phase angle $\phi$ may be alternatively assumed to range from 20° lagging (inductive load) to 80° lagging (inductive load), i.e., 20°<$\phi$<80°.

As noted above, for each wiring configuration described herein, the branch circuit current sensor diagnosis has a different set of rules for determining sensor phase association and polarity based upon determined phase angle. Thus, according to an aspect of the disclosed concept, each particular wiring configuration described herein has an associated table (referred to as a "Current Sensor Diagnosis Table") that summarizes the set of rules applicable to particular wiring configuration. The current sensor diagnosis methodology according to the disclosed concept determines the current sensor's polarity and phase association by reading appropriate entries in the appropriate table. The Current Sensor Diagnosis Tables that are applicable to the 3-Phase 4-Wire Wye, 3-Phase 3-Wire Delta, 3-Phase 4-Wire Delta, and 3-Phase Corner-Grounded Delta wiring configurations are described in detail in the United States Patent Application Publication Number 2015/0042311, which is owned by the assignee hereof and incorporated herein by reference in its entirety. As a result, the rationale behind those tables is not discussed in detail herein. Instead, the Current Sensor Diagnosis Table for each of those wiring configurations is provided below (Tables 2-5) for convenience. Furthermore, one aspect of the disclosed concept is the provision of Current Sensor Diagnosis Table for the 2-Phase Wye, Single-Phase 3-Wire, and Single-Phase 2-Wire wiring configurations, each of which is described in detail below (Tables 6-8).

TABLE 2

Current Sensor Diagnosis for 3-Phase 4-Wire Wye Wiring Configuration

| $\phi_A$ | | $\phi_B$ | | $\phi_C$ | |
|---|---|---|---|---|---|
| $0° \le \phi_A < 50°$ or $350° < \phi_A < 360°$ | $I_A$ | $0° \le \phi_B < 50°$ or $350° < \phi_B < 360°$ | $I_B$ | $0° \le \phi_C < 50°$ or $350° < \phi_C < 360°$ | $I_C$ |
| $50° < \phi_A < 110°$ | $-I_C$ | $50° < \phi_B < 110°$ | $-I_A$ | $50° < \phi_C < 110°$ | $-I_B$ |
| $110° < \phi_A < 170°$ | $I_B$ | $110° < \phi_B < 170°$ | $I_C$ | $110° < \phi_C < 170°$ | $I_A$ |
| $170° < \phi_A < 230°$ | $-I_A$ | $170° < \phi_B < 230°$ | $-I_B$ | $170° < \phi_C < 230°$ | $-I_C$ |
| $230° < \phi_A < 290°$ | $I_C$ | $230° < \phi_B < 290°$ | $I_A$ | $230° < \phi_C < 290°$ | $I_B$ |
| $290° < \phi_A < 350°$ | $-I_B$ | $290° < \phi_B < 350°$ | $-I_C$ | $290° < \phi_C < 350°$ | $-I_A$ |

TABLE 3

Current Sensor Diagnosis for 3-Phase 3-Wire Delta Wiring Configuration

| $\phi_A$ | | $\phi_B$ | | $\phi_C$ | |
|---|---|---|---|---|---|
| $0° \le \phi_A < 50°$ or $350° < \phi_A < 360°$ | $I_A$ | $0° \le \phi_B < 50°$ or $350° < \phi_B < 360°$ | $I_B$ | $0° \le \phi_C < 50°$ or $350° < \phi_C < 360°$ | $I_C$ |
| $50° < \phi_A < 110°$ | $-I_C$ | $50° < \phi_B < 110°$ | $-I_A$ | $50° < \phi_C < 110°$ | $-I_B$ |
| $110° < \phi_A < 170°$ | $I_B$ | $110° < \phi_B < 170°$ | $I_C$ | $110° < \phi_C < 170°$ | $I_A$ |
| $170° < \phi_A < 230°$ | $-I_A$ | $170° < \phi_B < 230°$ | $-I_B$ | $170° < \phi_C < 230°$ | $-I_C$ |
| $230° < \phi_A < 290°$ | $I_C$ | $230° < \phi_B < 290°$ | $I_A$ | $230° < \phi_C < 290°$ | $I_B$ |
| $290° < \phi_A < 350°$ | $-I_B$ | $290° < \phi_B < 350°$ | $-I_C$ | $290° < \phi_C < 350°$ | $-I_A$ |

TABLE 4

Current Sensor Diagnosis for 3-Phase 4-Wire Delta Wiring Configuration

| $\phi_A$ | | $\phi_B$ | | $\phi_C$ | |
|---|---|---|---|---|---|
| $0° \le \phi_A < 50°$ or $350° < \phi_A < 360°$ | $I_A$ | $20° < \phi_B < 80°$ | $I_B$ | $320° < \phi_C < 360°$ or $0° \le \phi_C < 20°$ | $I_C$ |
| $50° < \phi_A < 110°$ | $-I_C$ | $80° < \phi_B < 140°$ | $-I_A$ | $20° < \phi_C < 80°$ | $-I_B$ |
| $110° < \phi_A < 170°$ | $I_B$ | $140° < \phi_B < 200°$ | $I_C$ | $80° < \phi_C < 140°$ | $I_A$ |
| $170° < \phi_A < 230°$ | $-I_A$ | $200° < \phi_B < 260°$ | $-I_B$ | $140° < \phi_C < 200°$ | $-I_C$ |
| $230° < \phi_A < 290°$ | $I_C$ | $260° < \phi_B < 320°$ | $I_A$ | $200° < \phi_C < 260°$ | $I_B$ |
| $290° < \phi_A < 350°$ | $-I_B$ | $320° < \phi_B < 360°$ or $0° \le \phi_B < 20°$ | $-I_C$ | $260° < \phi_C < 320°$ | $-I_A$ |

TABLE 5

Current Sensor Diagnosis for 3-Phase Corner-Grounded Delta Wiring Configuration

| $\phi_A$ | | $\phi_B$ | $\phi_C$ | |
|---|---|---|---|---|
| $20° < \phi_A < 80°$ | $I_A$ | N/A | $0° \le \phi_C < 20°$ or $320° < \phi_C < 360°$ | $I_C$ |
| $80° < \phi_A < 140°$ | $-I_C$ | N/A | $20° < \phi_C < 80°$ | $-I_B$ |
| $140° < \phi_A < 200°$ | $I_B$ | N/A | $80° < \phi_C < 140°$ | $I_A$ |
| $200° < \phi_A < 260°$ | $-I_A$ | N/A | $140° < \phi_C < 200°$ | $-I_C$ |
| $260° < \phi_A < 320°$ | $I_C$ | N/A | $200° < \phi_C < 260°$ | $I_B$ |
| $320° < \phi_A < 360°$ or $0° \le \phi_A < 20°$ | $-I_B$ | N/A | $260° < \phi_C < 320°$ | $-I_A$ |

The discussion will now switch to the Current Sensor Diagnosis table for the 2-Phase Wye, Single-Phase 3-Wire, and Single-Phase 2-Wire wiring configurations.

With respect to 2-Phase Wye, the load impedance phase angle is limited to between 10° leading and 50° lagging. Therefore, the phase angle between voltage $V_{An}$ and current measurement $I_A$ ranges from 10° leading to 50° lagging. Likewise, the phase angle between voltage $V_{Bn}$ and current measurement $I_B$ ranges from 10° leading to 50° lagging. This is demonstrated by the phasor diagram 62A of FIG. 10A.

Because, there is no load connected between phase C and node "n" in 2-phase Wye wiring configuration (FIG.), therefore, $I_C=0$.

The Kirchhoff's current law dictates that the sum of current measurements at node "n" is 0, i.e., $$I_A+I_B=0. \tag{9}$$

According to FIG., $$I_A=V_{An}/Z_A, I_B=V_{Bn}/Z_B. \tag{10}$$

Substituting equation (10) into equation (9) yields $$V_{An}/Z_A+V_{Bn}/Z_B=0. \tag{11}$$

Note that equation (11) can be further simplified using the symmetric load assumption in equation (8).

$$V_{An}+V_{Bn}=0. \tag{12}$$

The voltage measurement $V_{AB}$ is related to $V_{An}$ and $V_{Bn}$ via $$V_{AB}=V_{An}-V_{Bn} \tag{13}$$

Adding equation (12) to equation (13) yields $$V_{AB}=2V_{An} \tag{14}$$

Therefore, $V_{An}=V_{AB}/2$, and $V_{Bn}=-V_{AB}/2$. The resulting voltage measurements $V_{AN}$, $V_{BN}$, and $V_{CN}$, when expressed in phasors, are shown phasor diagram 64 of FIG. 11.

Because $I_C=0$, therefore, if the amplitude of $I_A$ is 0, i.e., $|I_A|=0$, where $|\cdot|$ denotes the amplitude of a phasor quantity, then the current sensor 34 intended to measure phase A current must have been mistakenly associated with phase C current-carrying conductor.

Figure 10A:
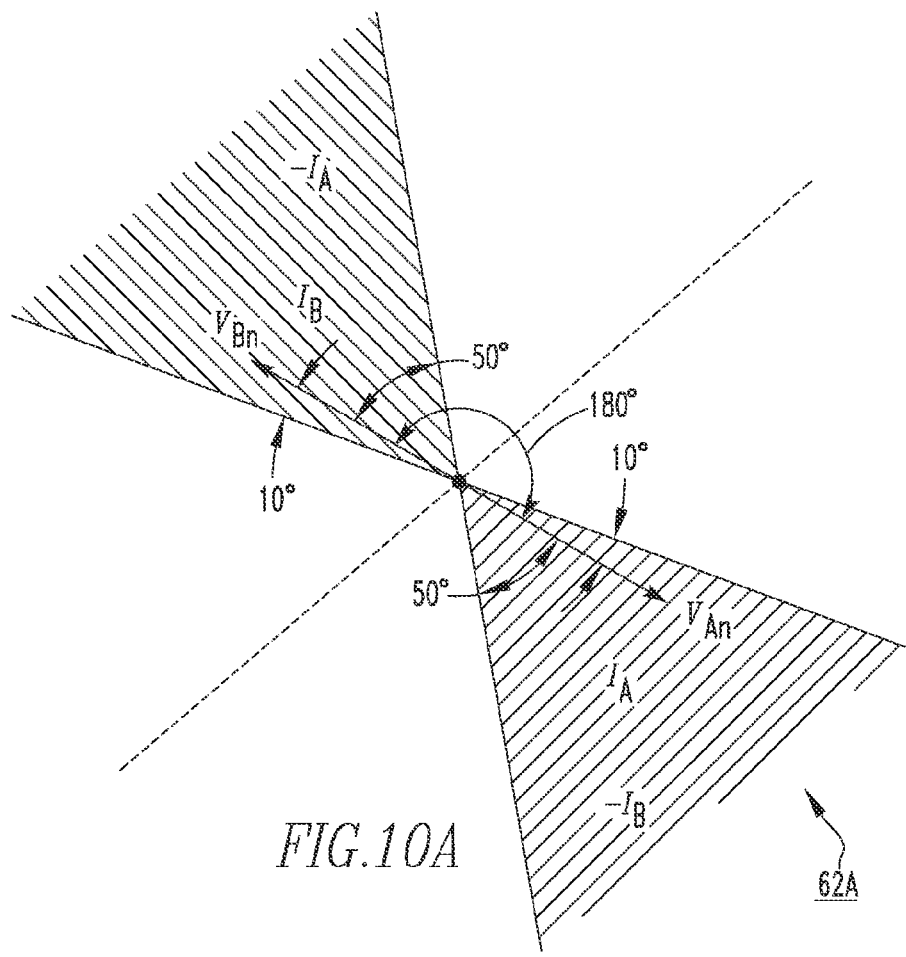
FIG. 10A is a phasor diagram showing the relationship between voltages $V_{An}$, $V_{Bn}$, and current measurements $I_A$, $I_B$ according to one embodiment of the disclosed concept.
Figure 10B:
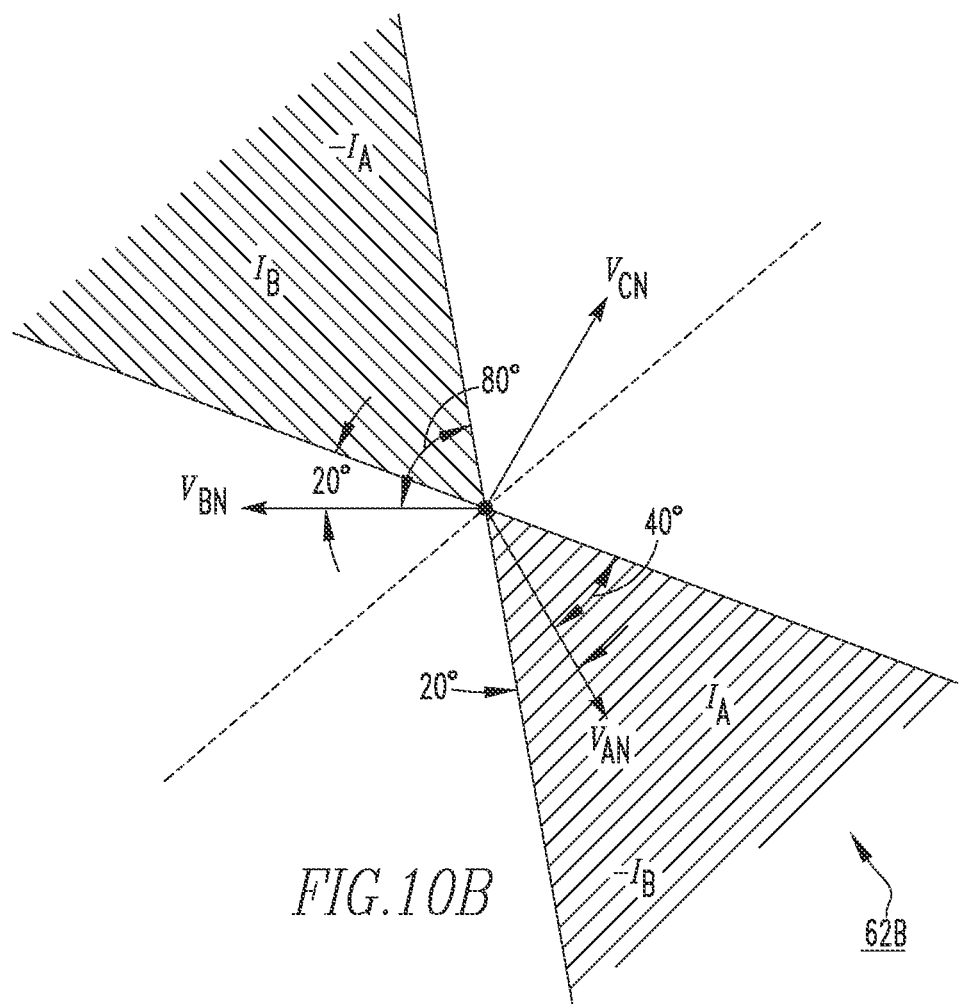
FIG. 10B is a phasor diagram showing the relationship between voltage measurements $V_{AN}$, $V_{BN}$, $V_{CN}$, and current measurements $I_A$, $I_B$ according to one embodiment of the disclosed concept.
Figure 11:
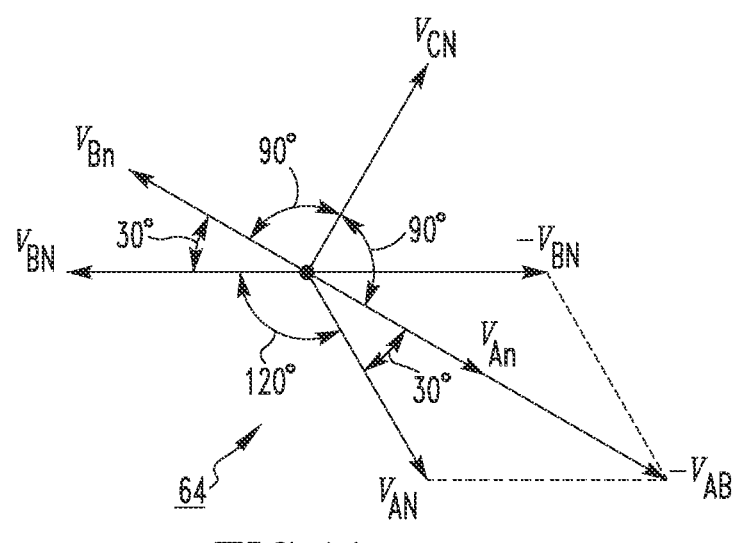
FIG. 11 is a phasor diagram of voltages $V_{An}$, $V_{Bn}$ and voltage measurements $V_{AN}$, $V_{BN}$, $V_{CN}$ according to one embodiment of the disclosed concept.

Combining FIGS. 10A and 11 yields FIG. 10B. FIG. 10B is a phasor diagram 62B showing relationships between voltage measurements $V_{AN}$, $V_{BN}$, $V_{CN}$, and current measurements $I_A$, $I_B$. The shaded areas in FIG. 10B indicate angular ranges of current measurements with respect to voltage measurements.

Table 6 summarizes cases from FIG. 10B, and shows the current sensor diagnosis for 2-phase Wye wiring configuration. Note that in Table 6, $\phi_A$ denotes the phase angle between the voltage measurement $V_{AN}$ and the current measurement from a current sensor 34 intended to measure phase A current, $\phi_B$ denotes the phase angle between the voltage measurement $V_{BN}$ and the current measurement from a current sensor 34 intended to measure phase B current. Because $I_C=0$, the phase angle between the voltage measurement $V_{CN}$ and the current measurement from a current sensor intended to measure phase C current, $\phi_C$, is not available.

TABLE 6

Current Sensor Diagnosis for 2-Phase Wye Wiring Configuration

| $\phi_A$ | | $\phi_B$ | | $\phi_C$ | |
|---|---|---|---|---|---|
| 0° ≤ $\phi_A$ < 20° or 320° < $\phi_A$ < 360° | $I_A$ or $-I_B$ | 0° ≤ $\phi_B$ < 20° or 260° < $\phi_B$ < 360° | — | N/A | — |
| 20° < $\phi_A$ < 140° | — | 20° < $\phi_B$ < 80° | $I_B$ or $-I_A$ | N/A | — |
| 140° < $\phi_A$ < 200° | $-I_A$ or $I_B$ | 80° < $\phi_B$ < 200° | — | N/A | — |
| 200° < $\phi_A$ < 320° | — | 200° < $\phi_B$ < 260° | $-I_B$ or $I_A$ | N/A | — |

In a 2-Phase Wye wiring configuration, if a first branch circuit current sensor 34 is intended to measure phase A current, and a second branch circuit current sensor 34 is intended to measure phase B current, then there are 8 possible scenarios for these particular branch circuit current sensors 34.

1) The first branch circuit current sensor 34 is wired to phase A current-carrying conductor with a normal polarity. The second branch circuit current sensor 34 is wired to phase B current-carrying conductor with a normal polarity. Consequently, the current measurement from first branch circuit current sensor is $I_A$, and the current measurement from second branch circuit current sensor is $I_B$.
2) The first branch circuit current sensor 34 is wired to phase A current-carrying conductor with a flipped polarity. The second branch circuit current sensor 34 is wired to phase B current-carrying conductor with a normal polarity. Consequently, the current measurement from first branch circuit current sensor is $-I_A$, and the current measurement from second branch circuit current sensor is $I_B$.
3) The first branch circuit current sensor 34 is wired to phase A current-carrying conductor with a normal polarity. The second branch circuit current sensor 34 is wired to phase B current-carrying conductor with a flipped polarity. Consequently, the current measurement from first branch circuit current sensor is $I_A$, and the current measurement from second branch circuit current sensor is $-I_B$.
4) The first branch circuit current sensor 34 is wired to phase A current-carrying conductor with a flipped polarity. The second branch circuit current sensor 34 is wired to phase B current-carrying conductor with a flipped polarity. Consequently, the current measurement from first branch circuit current sensor is $-I_A$, and the current measurement from second branch circuit current sensor is $-I_B$.
5) The first branch circuit current sensor 34 is wired to phase B current-carrying conductor with a normal polarity. The second branch circuit current sensor 34 is wired to phase A current-carrying conductor with a normal polarity. Consequently, the current measurement from first branch circuit current sensor is $I_B$, and the current measurement from second branch circuit current sensor is $I_A$.
6) The first branch circuit current sensor 34 is wired to phase B current-carrying conductor with a flipped polarity. The second branch circuit current sensor 34 is wired to phase A current-carrying conductor with a normal polarity. Consequently, the current measurement from first branch circuit current sensor is $-I_B$, and the current measurement from second branch circuit current sensor is $I_A$.
7) The first branch circuit current sensor 34 is wired to phase B current-carrying conductor with a normal polarity. The second branch circuit current sensor 34 is wired to phase A current-carrying conductor with a flipped polarity. Consequently, the current measurement from first branch circuit current sensor is $I_B$, and the current measurement from second branch circuit current sensor is $-I_A$.
8) The first branch circuit current sensor 34 is wired to phase B current-carrying conductor with a flipped polarity. The second branch circuit current sensor 34 is wired to phase A current-carrying conductor with a flipped polarity. Consequently, the current measurement from first branch circuit current sensor is $-I_B$, and the current measurement from second branch circuit current sensor is $-I_A$.

According to Table 6, for the first branch current sensor 34, if 140°≤$\phi_A$<200°, then this first branch current sensor 34 is not correctly wired to phase A current-carrying conductor with a normal polarity. Therefore, cases 2), 4), 5) and 7) from the above list can be detected as incorrect wiring.

According to Table 6, for the second branch current sensor 34, if 200°≤φ_B<260°, then this second branch current sensor 34 is not correctly wired to phase B current-carrying conductor with a normal polarity. Therefore, cases 3), 4), 5) and 6) from the above list can be detected as incorrect wiring.

According to Table 6, for the first branch current sensor 34, if 0°≤φ_A<20° or 320°<φ_A<360°, and for the second branch current sensor 34, if 20°≤φ_B<80°, then either case 1) or case 8) from the above list can result in such detection results.

In this case, to differentiate whether case 1) or case 8) from the above list is true, other indicators, such as a label of phase attached to the current sensor, and a label of phase attached to the current-carrying conductor, may aid the final determination.

This description below discloses steps to diagnose current sensors 34 for the single-phase 3-wire wiring configuration using the phase angles between voltage measurements $V_{AN}$, $V_{BN}$ and current measurements $I_A$, $I_B$, respectively.

According to the single-phase 3-wire wiring configuration (FIG. 7), the voltage measurements $V_{AN}$, $V_{BN}$, are related to voltages $V_{An}$, $V_{Bn}$ via $$V_{AN} = V_{An} \quad (15)$$

$$V_{BN} = V_{Bn} \quad (16)$$

Therefore, according to equations (15) and (16), $V_{An} = -V_{Bn}$.

Figure 12:
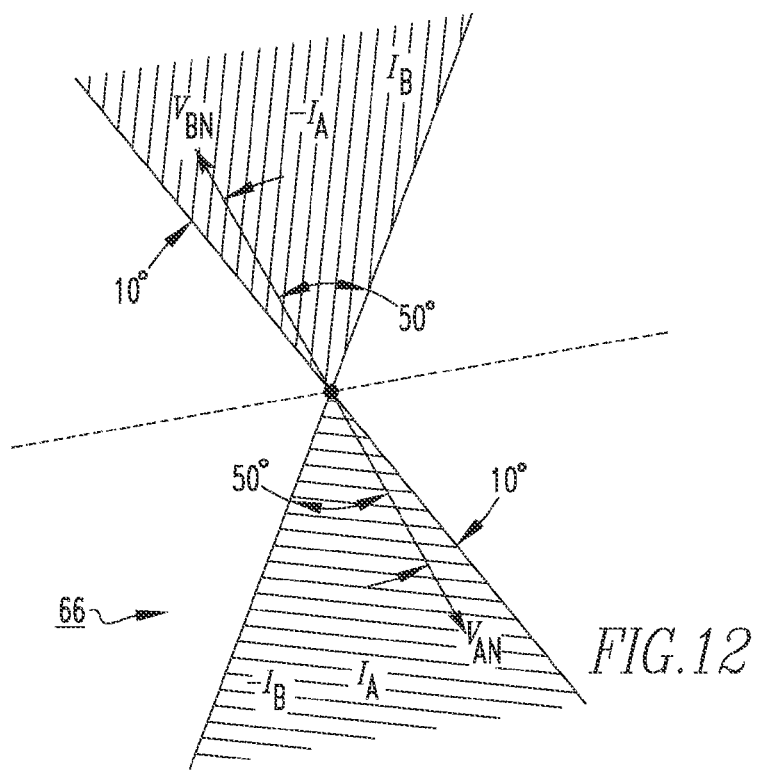
FIG. 12. is a phasor diagram showing the relationship between voltage measurements $V_{AN}$, $V_{BN}$, and current measurements $I_A$, $I_B$ according to one embodiment of the disclosed concept.

FIG. 12 is a phasor diagram 66 showing the relationships between voltage measurements $V_{AN}$, $V_{BN}$, and current measurements $I_A$, $I_B$. The shaded areas in FIG. 12 indicate angular ranges of current measurements with respect to voltage measurements.

Table 7 summarizes cases from FIG. 12, and shows the current sensor diagnosis for single-phase 3-wire wiring configuration. Note that in Table 7. φ_A denotes the phase angle between the voltage measurement $V_{AN}$ and the current measurement from a current sensor 34 intended to measure phase A current, φ_B denotes the phase angle between the voltage measurement $V_{BN}$ and the current measurement from a current sensor intended to measure phase B current.

TABLE 7

Current Sensor Diagnosis for Single-Phase 3-Wire Wiring Configuration

| φ_A | | φ_B | |
|---|---|---|---|
| 0° ≤ φ_A < 50° or 350° < φ_A < 360° | $I_A$ or $-I_B$ | 0° ≤ φ_A < 50° or 350° < φ_A < 360° | $I_B$ or $-I_A$ |
| 50° < φ_A < 170° | — | 50° < φ_A < 170° | — |
| 170° < φ_A < 230° | $-I_A$ or $I_B$ | 170° < φ_A < 230° | $-I_B$ or $I_A$ |
| 200° < φ_A < 350° | — | 200° < φ_A < 350° | — |

According to Table 7, φ_A or φ_B alone cannot uniquely determine that the current sensor 34 is correctly associated with the intended phase current-carrying conductor, and that the current sensor 34 has a normal polarity. For example, for a current sensor intended to measure phase A current, if 0°≤φ_A<50° or 350°<φ_A<360°, the current sensor can be either of the following two possible scenarios:

1) The current sensor 34 is associated with phase A current-carrying conductor, and has a normal polarity.
2) The current sensor 34 is associated with phase B current-carrying conductor, and at the same time has a flipped polarity.

In this case, other indicators, such as a label of phase attached to the current sensor, and a label of phase attached to the current-carrying conductor, may aid the final determination.

Figure 13:
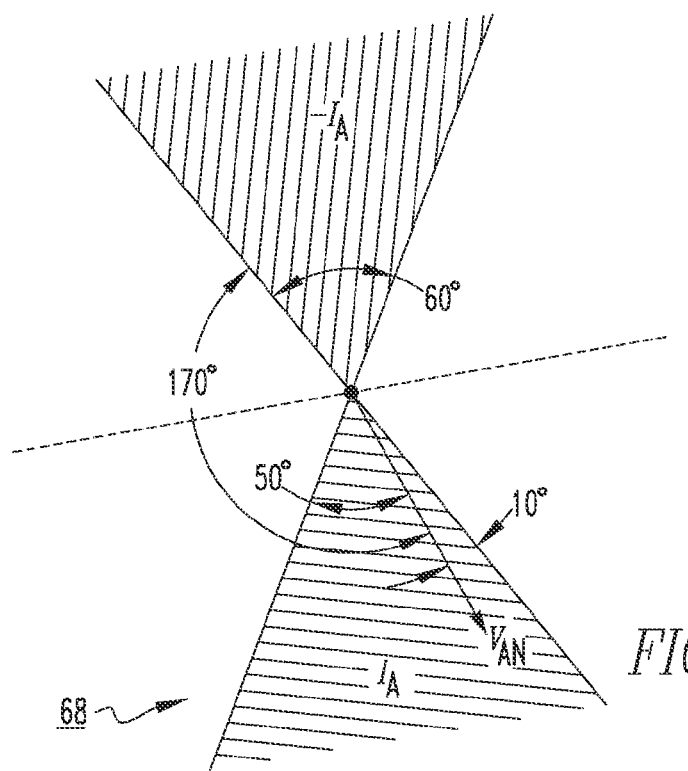
FIG. 13 is a phasor diagram showing the relationship between voltage measurements $V_{AN}$ and current measurements $I_A$ according to one embodiment of the disclosed concept.

The single-phase 2-wire wiring configuration is a special case of the single-phase 3-wire wiring configuration. FIG. 13 is a phasor diagram 68 showing the relationships between voltage measurements $V_{AN}$, $V_{BN}$, and current measurements $I_A$, $I_B$. The shaded areas in FIG. 13 indicate angular ranges of current measurements with respect to voltage measurements.

Table 8 summarizes cases from FIG. 13, and shows the current sensor diagnosis for single-phase 2-wire wiring configuration. Note that in Table 8, φ_A denotes the phase angle between the voltage measurement $V_{AN}$ and the current measurement from a current sensor 34 intended to measure phase A current.

TABLE 8

Current Sensor Diagnosis for Single-Phase 2-Wire Wiring Configuration

| φ_A | |
|---|---|
| 0° ≤ φ_A < 50° or 350° < φ_A < 360° | $I_A$ |
| 50° < φ_A < 170° | — |
| 170° < φ_A < 230° | $-I_A$ |
| 200° < φ_A < 350° | — |

Validation of Branch Circuit Current Sensor Diagnosis

In branch circuit monitoring system 2, after current sensor diagnosis as described herein is performed for each branch circuit, the final branch circuit current sensor diagnosis results can be further validated if main current sensors 26 have been installed and configured in the same branch circuit monitoring system 2. The discussion below discloses steps to validate branch circuit current sensor diagnosis results using real power P and reactive power Q.

For each branch circuit current sensor 34, the real power P (in watts) and the apparent power S (in volts amperes) are available. In addition, the power factor PF is also available. Given a non-zero PF, the reactive power Q (in vars) is then calculated via $$Q = \frac{PF}{|PF|} \cdot \sqrt{S^2 - P^2} \quad (17)$$

where |PF| is the absolute value of the power factor.

For the following 4 wiring configurations: 3-Phase 4-Wire Wye, 3-Phase 3-Wire Delta, 3-Phase 4-Wire Delta, and 3-Phase Corner-Grounded Delta, once current sensor diagnosis as described herein is completed, each branch circuit current sensor 34 is associated with phase A current-carrying conductor 10A, or phase B current-carrying conductor 10B, or alternatively phase C current-carrying conductor 10C. A total phase A real power $P_{A,total}$ is obtained by summing up real power quantities for all branch circuit current sensors 34 that are associated with phase A current-carrying conductor 10A. Similarly, a total phase B real power $P_{B,total}$ is obtained by summing up real power quantities for all branch circuit current sensors 34 that are associated with phase B current-carrying conductor 10B, and a total phase C real power $P_{C,total}$ is obtained by summing up real power quantities for all branch circuit current sensors 34 that are associated with phase C current-carrying conductor 10C. Likewise, $Q_{A,total}$, $Q_{B,total}$, $Q_{C,total}$ are obtained for the branch circuit monitoring system 2.

For the branch circuit monitoring system 2 based on the above 4 wiring configurations, the total real and reactive power quantities are also calculated from the voltage measurements made by main voltage sensors 24 and the current measurements made by main current sensor 26. They are denoted as $P'_{A,total}$, $P'_{B,total}$, $P'_{C,total}$ and $Q'_{A,total}$, $Q'_{B,total}$, $Q'_{C,total}$.

Table 9 below shows a method that may be used to validate branch circuit current sensor diagnosis results for the following 4 wiring configurations, 3-Phase 4-Wire Wye, 3-Phase 3-Wire Delta, 3-Phase 4-Wire Delta, and 3-Phase Corner-Grounded Delta, according to an exemplary embodiment of an aspect of the disclosed concept. For example, if $P_{B,total}=P'_{B,total}$ and $Q_{B,total}=Q'_{B,total}$, then the branch circuit current sensor diagnosis results are validated OK for all current sensors 34 associated with phase B current-carrying conductors. As another example, if $P_{C,total} \neq P'_{C,total}$ or $Q_{C,total} \neq Q'_{C,total}$, then the branch circuit current sensor diagnosis results are not validated OK for all current sensors 34 associated with phase C current-carrying conductors.

TABLE 9

Validation of Branch Circuit Current Sensor Diagnosis Using 3-Phase Real Power and Reactive Power Quantities

| Phase A | $P_{A, total} = P'_{A, total}$ and $Q_{A, total} = Q'_{A, total}$ | Branch circuit current sensor diagnosis results are validated OK. |
|---|---|---|
| | $P_{A, total} \neq P'_{A, total}$ or $Q_{A, total} \neq Q'_{A, total}$ | Branch circuit current sensor diagnosis results are not validated OK. |
| Phase B | $P_{B, total} = P'_{B, total}$ and $Q_{B, total} = Q'_{B, total}$ | Branch circuit current sensor diagnosis results are validated OK. |
| | $P_{B, total} \neq P'_{B, total}$ or $Q_{B, total} \neq Q'_{B, total}$ | Branch circuit current sensor diagnosis results are not validated OK. |
| Phase C | $P_{C, total} = P'_{C, total}$ and $Q_{C, total} = Q'_{C, total}$ | Branch circuit current sensor diagnosis results are validated OK. |
| | $P_{C, total} \neq P'_{C, total}$ or $Q_{C, total} \neq Q'_{C, total}$ | Branch circuit current sensor diagnosis results are not validated OK. |

Following the method outlined above, for the following two wiring configurations: 2-Phase Wye and Single-Phase 3-Wire, a total phase A real power $P_{A,total}$ and a total phase A reactive power $Q_{A,total}$ are obtained by summing up real and reactive power quantities for all branch circuit current sensors 34 that are associated with phase A current-carrying conductor 10A, and a total phase B real power $P_{B,total}$ and a total phase B reactive power $Q_{B,total}$ are obtained by summing up real and reactive power quantities for all branch circuit current sensors 34 that are associated with phase B current-carrying conductor 10B.

For same branch circuit monitoring system 2 based on the above 2 wiring configurations, the total real and reactive power quantities are also calculated from the voltage measurements made by main voltage sensors 24 and the current measurements made by main current sensor 26. They are denoted as $P'_{A,total}$, $P'_{B,total}$, and $Q'_{A,total}$, $Q'_{B,total}$.

Table 10 below shows a method that may be used to validate branch circuit current sensor diagnosis results for the following 2 wiring configurations, 2-Phase Wye and Single-Phase 3-Wire, according to another exemplary embodiment of an aspect of the disclosed concept.

TABLE 10

Validation of Branch Circuit Current Sensor Diagnosis Using 2-Phase Real Power and Reactive Power Quantities

| Phase A | $P_{A, total} = P'_{A, total}$ and $Q_{A, total} = Q'_{A, total}$ | Branch circuit current sensor diagnosis results are validated OK. |
|---|---|---|
| | $P_{A, total} \neq P'_{A, total}$ or $Q_{A, total} \neq Q'_{A, total}$ | Branch circuit current sensor diagnosis results are not validated OK. |
| Phase B | $P_{B, total} = P'_{B, total}$ and $Q_{B, total} = Q'_{B, total}$ | Branch circuit current sensor diagnosis results are validated OK. |
| | $P_{B, total} \neq P'_{B, total}$ or $Q_{B, total} \neq Q'_{B, total}$ | Branch circuit current sensor diagnosis results are not validated OK. |

For the Single-Phase 2-Wire wiring configuration, a total phase A real power $P_{A,total}$ and a total phase A reactive power $Q_{A,total}$ are obtained by summing up real and reactive power quantities for all branch circuit current sensors 34 that are associated with phase A current-carrying conductor 10A. The total real and reactive power quantities, denoted as $P'_{A,total}$ and $Q'_{A,total}$, are also calculated from the voltage measurements made by main voltage sensors 24 and the current measurements made by main current sensor 26.

Table 11 shows the method that may be used to validate branch circuit current sensor diagnosis results for the Single-Phase 2-Wire wiring configurations according to a further aspect of the disclosed concept.

TABLE 11

Validation of Branch Circuit Current Sensor Diagnosis Using Single-Phase Real Power and Reactive Power Quantities

| Phase A | $P_{A, total} = P'_{A, total}$ and $Q_{A, total} = Q'_{A, total}$ | Branch circuit current sensor diagnosis results are validated OK. |
|---|---|---|
| | $P_{A, total} \neq P'_{A, total}$ or $Q_{A, total} \neq Q'_{A, total}$ | Branch circuit current sensor diagnosis results are not validated OK. |

Wiring Configuration Determination

Provided below is a description of a methodology for determining the number of phases in a system, such as branch circuit monitoring system 2, and then further determining the wiring configuration of the system according to still a further aspect of the disclosed concept. This methodology is, in the exemplary embodiment, accomplished using only the RMS voltage measurements made by voltage sensors 24, 28 and assumes unused voltage terminals of the branch circuit meter modules 14A, 14B are tied to the neutral voltage node comprising neutral conductor 32.

The methodology of this aspect of the disclosed concept uses Line to Line and Line to Neutral voltage measurements to determine the wiring configuration without phase angle information. In particular, the voltage sensors 24, 28 will provide Line to Neutral voltage measurements for each of the conductors 10A, 10B, 10C of main busbar 10 (i.e., each phase) to branch circuit meter modules 14. From that information, branch circuit meter modules 14 are able to determine Line to Line voltage measurements for each of the conductors 10A, 10B, 10C of main busbar 10 (i.e., each phase). In order to distinguish between single phase and polyphase systems, the methodology first establishes the number of non-zero Line to Neutral voltage measurements being made by voltage sensors 24, 28. If there are only two non-zero measurements, it can be established that the system is a Single-Phase 2-Wire configuration. If there are three non-zero measurements, the system could be a 2-phase Wye, Single-Phase 3-Wire, or a 3-phase configuration. Furthermore, $V_{min}$ refers to the smallest Line to Line voltage measurement, and $V_{max}$, refers to the largest Line to Line voltage measurement. If $V_{max}$ is equal to $V_{min}$, the methodology will establish that the system is a 3-phase system. If $V_{max}$ is twice the value of $V_{min}$, the methodology will establish that the system is a 2-phase Split. If $V_{max}$ is larger than $V_{min}$ by a factor of the square root of 3, the methodology will establish that the system is a 2-phase Wye. One particular exemplary embodiment determines the phase mathematically by determining the ratio of $V_{min}$:$V_{max}$ and using the following boundaries (boundaries determined as the midpoint between the two expected values):

$$\frac{V_{min}}{V_{max}} = V_{ratio}$$

if $V_{ratio} > 0.789$ then the wiring configuration is a 3-phase configuration if $V_{ratio} < 0.539$ then the wiring configuration is a Single-Phase 3-Wire configuration if $0.789 \geq V_{ratio} \geq 0.539$ then the wiring configuration is a 2-phase Wye configuration If, under the methodology, the system is determined to be a 3-phase system, the system can be further categorized as a Corner-Grounded Delta, 4-Wire Delta, or a balanced 4-Wire Wye depending on the Line to Neutral voltage measurements. A 3-Phase 3-Wire Delta can be categorized by the absence of a Line to Neutral voltage measurement. In this aspect, $V_{min}$ refers to the phase with the smallest Line to Neutral voltage measurement, and $V_{max}$ refers to the phase with the largest Line to Neutral voltage measurement. Next, the methodology divides $V_{min}$ by $V_{max}$. In the case of a Corner-Grounded Delta, the min value should be zero or close to it. In the case of a 4-Wire Delta, also known as a High-Leg Delta or Center-Tapped Delta, the $V_{ratio}$ value is expected to be close to 1/1.73 or one over the square root of 3. In the case of a 4-Wire Wye configuration, $V_{ratio}$ value will be 1 if the system is perfectly balanced, but certainly not much lower than 1. Therefore, an adequate method of distinguishing between the three configurations identified above is as follows:

$$\frac{V_{min}}{V_{max}} = V_{ratio}$$

$$\frac{2}{\sqrt{3}+1} = .732$$

$$\frac{.732 + 0}{2} = .366$$

if $V_{ratio} < 0.366$ then Voltage Configuration is Corner-Grounded Delta if $0.366 \leq V_{ratio} \cdot 0.732$ then Voltage Configuration is 4-Wire Delta if $V_{ratio} > 0.732$ then Voltage Configuration is 4-Wire Wye Diagnosis of Voltage Swap Conditions A further aspect of the disclosed concept relates to diagnosing voltage swap conditions. For balanced wiring configurations, voltage phases are interchangeable and indistinguishable from each other. However, configurations that utilize a Neutral Voltage can be miswired by swapping the Neutral with a Phase voltage (referred to as a neutral swap). Also, in configurations with imbalanced voltages, miswiring can occur between Phases (referred to as a phase swap). Both of these miswiring errors can be diagnosed.

Neutral Swap can occur in 3-Phase 4-Wire Wye, 3-Phase 4-Wire Delta, and Single-Phase 3-Wire configurations. To diagnose Neutral Swaps with any of the 3-phase configurations, one sample of the Line to Line voltage measurements (ie, each phase is sampled) is taken. $V_{min}$ refers to the phase with the smallest Line to Line voltage measurement, and $V_{max}$ refers to the phase with the largest Line to Line voltage measurement. Next, the methodology divides $V_{min}$ by $V_{max}$. The following tables 12 and 13 show the possible $V_{ratio}$ values of a 120$V_{LN}$-based system for the correct wiring, and the swapping of Neutral with any phase of a 4-Wire Wye or 4-Wire Delta:

TABLE 12

Neutral Swap for 4-Wire Wye Configuration
4-Wire Wye Configuration

| Correct | N Swap with Phase |
|---|---|
| $V_{min}$ = 208 V | $V_{min}$ = 120 V |
| $V_{max}$ = 208 V | $V_{max}$ = 208 V |
| $V_{ratio}$ = 1 | $V_{ratio}$ = 0.577 |

TABLE 13

Neutral Swap for 4-Wire Delta Configuration
4-Wire Delta Configuration

| Correct | N Swap w/Hi-Leg | N Swap w/Lo-Leg |
|---|---|---|
| $V_{min}$ = 240 V | $V_{min}$ = 120 V | $V_{min}$ = 120 V |
| $V_{max}$ = 240 V | $V_{max}$ = 240 V | $V_{max}$ = 208 V |
| $V_{ratio}$ = 1 | $V_{ratio}$ = .5 | $V_{ratio}$ = 0.577 |

Therefore, an adequate method of detecting if the measurement point of neutral conductor 32 has been wired correctly is as follows:

$$\frac{V_{min}}{V_{max}} = V_{ratio}$$

$$\frac{2}{\sqrt{3}+1} = .732$$

if $V_{ratio} > 0.732$ then the Neutral Has Been Wired Correctly if $V_{ratio} \leq 0.732$ then the Neutral Has Been Wired Incorrectly To diagnose a neutral swap condition with the Single-Phase 3-Wire configuration, tone sample of the Line to Neutral voltages of each phase is taken. $V_A$ refers to the first voltage and $V_B$ refer to the second voltage. If one is lower than the other by ½, then the lower one is swapped with neutral. The following table 14 shows example values of a 120$V_{LN}$-based system for the correct wiring, and the swapping of Neutral with either phase:

TABLE 14

Neutral Swap for Single-Phase 3-Wire Configuration
Single-Phase 3-Wire Configuration

| Correct | N Swap w/Phase A | N Swap w/Phase B |
|---|---|---|
| $V_A$ = 120 V | $V_A$ = 120 V | $V_A$ = 240 V |
| $V_B$ = 120 V | $V_B$ = 240 V | $V_B$ = 120 V |

A phase swap condition can be detected in the unbalanced phase configuration of 3-Phase 4-Wire Delta with its identification of the Hi-leg. According to another aspect of the disclosed concept, one sample of the Line to Neutral voltages of each phase is taken. $V_A$, $V_B$, and $V_C$ refer to the voltages of each phase. The Hi-leg can then be identified by the voltage with the highest value. The following table 15 shows example values of a $120V_{LN}$-based system:

TABLE 15

Phase Swap for Single-Phase 3-Wire Configuration
Single-Phase 3-Wire Configuration

| $V_A$ is Hi-Leg | $V_B$ is Hi-Leg | $V_C$ is Hi-Leg |
|---|---|---|
| $V_A$ = 208 V | $V_A$ = 120 V | $V_A$ = 120 V |
| $V_B$ = 120 V | $V_B$ = 208 V | $V_B$ = 120 V |
| $V_C$ = 120 V | $V_C$ = 120 V | $V_C$ = 208 V |

A mismatch in the expected Hi-leg from the identified Hi-leg would be a miswire.

Branch Circuit Sensor Grouping

In accordance with a further aspect of the disclosed concept, as part of the commissioning process for branch circuit monitoring system 2, branch circuit sensors 34 are grouped together into virtual meters. These are highly dependent on the physical layout of branch circuit monitoring system 2, and can be diagnosed with information about the physical layout, and with data from the voltage and current sensors of the associated pairs.

For a polyphase system, the physical layout of branch circuits (each branch circuit being associated with a single pole of a circuit breaker 22) is typically in repeating phase order, or in repeating reverse phase order. By identifying the position of each branch circuit in the physical layout of branch circuit monitoring system 2, phase errors can be found if the branches do not follow one of the prescribed orders.

Below in Table 16 are typical physical layouts for 6 branches of 3-phase and 2-phase systems. 3-phase or 2-phase systems that don't use one of these layouts would generate an error.

TABLE 16

Typical Physical Layouts for 6 Branches
of 3-Phase and 2-Phase Systems

| | Mapping of Physical Layout To Branch Circuit Phases |
|---|---|
| 3-Phase Repeating Phase Order | ABCABC |
| 3-Phase Repeating Reverse Phase Order | CBACBA |
| 2-Phase Repeating Phase Order | ABABAB |
| 2-Phase Repeating Reverse Phase Order | BABABA |

One, two, or three branch circuit current sensors 34 can be grouped together to create a virtual meter. A virtual meter typically monitors different phases of the same balanced load 20, such as an HVAC or 3-phase motor, and are typically adjacent to each other physically. Thus, a typical virtual meter can define its branch circuits for active loads according to the following criteria: (i) each branch circuit and the associated branch circuit current sensor 34 in a virtual meter should link to a different phase with no duplicate phases; (ii) all branch circuits and the associated branch circuit current sensor 34 in a virtual meter should have the same or similar phase angle; (iii) all branch circuits and the associated branch circuit current sensor 34 in a virtual meter should have the same or similar current; (iv) all branch circuits and the associated branch circuit current sensor 34 in a virtual meter should be adjacent in the physical layout By analyzing each current, phase angle, and position in the physical layout of each branch circuit and the associated branch circuit current sensor 34, virtual meters can be identified with a high degree of confidence.

In accordance with the disclosed concept, analysis begins with identifying the possible virtual meters for each branch circuit and the associated branch circuit current sensor 34 according to the physical layout of branch circuit monitoring system 2. For example, Table 17 below shows a typical branch circuit in a 3-phase system can be part of up to 3 possible 3-phase meters or 2 possible 2-phase meters, as illustrated below.

TABLE 17

Possible Virtual Meters for a Typical Branch Circuit
Possible meters In a 3-phase system For Branch Circuit A

| 3 possible 3-phase meters | ABCABCA |
| | ABCABCA |
| | ABCABCA |
| 2 possible 2-phase meters | ABCABCA |
| | ABCABCA |

Branches and the associated branch circuit current sensor 34 located near the edge of the physical layout will have fewer possible meters than those located away from the edge. This method only identifies 3-phase meters on 3-phase 4-wire wye and 3-phase 3-wire delta systems, and 2-phase meters on 1-phase 3-wire systems.

Next, for each possible virtual meter, its branch circuit phase angle variance is calculated using this variance equation:

$$\sigma^2 = \frac{\sum (x - \mu)^2}{N},$$

where x is each of the branch circuit phase angles in the possible virtual meter, u is the average of the branch circuit phase angles in the possible virtual meter, and N is the number of branches and associated branch circuit current sensors 34 in the possible virtual meter. The branch circuit current variance for each possible virtual meter is also calculated using the same equation, where x is each of the branch circuit currents in the possible virtual meter, u is the average of the branch circuit currents in the possible virtual meter, and N is the number of branches and associated branch circuit current sensors 34 in the possible virtual meter.

Then for each branch circuit and the associated branch circuit current sensor 34, a candidate virtual meter is determined by comparing all of the variances of all the possible virtual meters that include it. If one of the virtual meters that includes the branch circuit has the lowest branch circuit phase angle variance and the lowest branch circuit current variance, it is determined to be a candidate virtual meter. Otherwise, there is no candidate virtual meter for that branch.

If there is a possible virtual meter where each of its branch circuits have determined the possible virtual meter to be their candidate virtual meter, then that possible virtual meter is identified as a virtual meter with high confidence. To increase confidence, a filter can be placed on the variances, such that if the variance between the phase angles or currents is too high, no candidate meter is identified.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A method for a branch current monitoring system employing a 2-Phase Wye wiring configuration, wherein the branch current monitoring system has a first phase and a second phase, the method comprising:
   obtaining a voltage measurement using a voltage sensor associated with the first phase;
   obtaining a current measurement using a branch circuit current sensor, wherein the branch circuit current sensor is intended to measure a phase current of the first phase;
   determining a phase angle between the voltage measurement and the current measurement; and
   using the phase angle and a set of rules including a plurality of predetermined rules to identify at least one phase association and at least one polarity for the branch circuit current sensor, wherein the using the phase angle and the set of rules comprises:
   determining that the branch circuit current sensor is one of: (i) associated with the first phase with a normal polarity or (ii) associated with the second phase with a flipped polarity in response to the phase angle satisfying a first one of the rules; or
   determining that the branch circuit current sensor is one of: (i) associated with the first phase with a flipped polarity or (ii) associated with the second phase with a normal polarity in response to the phase angle satisfying a second one of the rules, wherein the first one of the rules comprises the phase angle being within a first range or a second range and the second one of the rules comprises the phase angle being within a third range, and wherein the first range is greater than or equal to 0° and less than 20°, wherein the second range is greater than 320° and less than 360°, and wherein the third range is greater than 140° and less than 200°.

2. A method for a branch current monitoring system employing a 2-Phase Wye wiring configuration, wherein the branch current monitoring system has a first phase and a second phase, the method comprising:
   obtaining a voltage measurement using a voltage sensor associated with the first phase;
   obtaining a current measurement using a branch circuit current sensor, wherein the branch circuit current sensor is intended to measure a phase current of the first phase;
   determining a phase angle between the voltage measurement and the current measurement; and
   using the phase angle and a set of rules including a plurality of predetermined rules to identify at least one phase association and at least one polarity for the branch circuit current sensor, wherein the using the phase angle and the set of rules comprises:
   determining that the branch circuit current sensor is one of: (i) associated with the first phase with a normal polarity or (ii) associated with the second phase with a flipped polarity in response to the phase angle satisfying a first one of the rules; or
   determining that the branch circuit current sensor is one of: (i) associated with the first phase with a flipped polarity or (ii) associated with the second phase with a normal polarity in response to the phase angle satisfying a second one of the rules, wherein the first one of the rules comprises the phase angle being within a first range and the second one of the rules comprises the phase angle being within a second range, and wherein the first range is greater than 20° and less than 80°, and wherein the second range is greater than 200° and less than 260°.

3. A method for a branch current monitoring system employing a Single-Phase 3-Wire wiring configuration, wherein the branch current monitoring system has a first phase and a second phase, the method comprising:
   obtaining a voltage measurement using a voltage sensor associated with the first phase;
   obtaining a current measurement using a branch circuit current sensor, wherein the branch circuit current sensor is intended to measure a phase current of the first phase;
   determining a phase angle between the voltage measurement and the current measurement; and
   using the phase angle and a set of rules including a plurality of predetermined rules to identify at least one phase association and at least one polarity for the branch circuit current sensor, wherein the using the phase angle and the set of rules comprises:
   determining that the branch circuit current sensor is one of: (i) associated with the first phase with a normal polarity or (ii) associated with the second phase with a flipped polarity in response to the phase angle satisfying a first one of the rules; or
   determining that the branch circuit current sensor is one of: (i) associated with the first phase with a flipped polarity or (ii) associated with the second phase with a normal polarity in response to the phase angle satisfying a second one of the rules, wherein the first one of the rules comprises the phase angle being within a first range or a second range and the second one of the rules comprises the phase angle being within a third range, and wherein the first range is greater than or equal to 0° and less than 50°, wherein the second range is greater than 350° and less than 360°, and wherein the third range is greater than 170° and less than 230°.

4. A method for a branch current monitoring system employing a Single-Phase 2-Wire wiring configuration, wherein the branch current monitoring system has a first phase, the method comprising:
   obtaining a voltage measurement using a voltage sensor associated with the first phase;
   obtaining a current measurement using a branch circuit current sensor, wherein the branch circuit current sensor is intended to measure a phase current of the first phase;
   determining a phase angle between the voltage measurement and the current measurement; and
   using the phase angle and a set of rules including a plurality of predetermined rules to identify at least one phase association and at least one polarity for the branch circuit current sensor, wherein the using the phase angle and the set of rules comprises:
   determining that the branch circuit current sensor is associated with the first phase with a normal polarity in response to the phase angle satisfying a first one of the rules, wherein the first one of the rules comprises the phase angle being within a first range, and wherein the first range is greater than or equal to 0° and less than 50°; or determining that the branch circuit current sensor is associated with the first phase with a flipped polarity in response to the phase angle satisfying a second one of the rules, wherein the second one of the rules comprises the phase angle being within a second range, and wherein the second range is greater than or equal to 170° and less than 230°.

5. A branch circuit meter module for a branch current monitoring system employing a 2-Phase Wye wiring configuration, wherein the branch current monitoring system has a first phase and a second phase, the branch circuit meter module comprising:

a control system, wherein the control system stores and is structured to execute a number of routines, the number of routines being structured to:

receive a voltage measurement from a voltage sensor associated with the first phase;

receive a current measurement from a branch circuit current sensor, wherein the branch circuit current sensor is intended to measure a phase current of the first phase;

determine a phase angle between the voltage measurement and the current measurement; and use the phase angle and a set of rules including a plurality of predetermined rules to identify at least one phase association and at least one polarity for the branch circuit current sensor, wherein the routines are structured to use the phase angle and the set of rules by:

determining that the branch circuit current sensor is one of: (i) associated with the first phase with a normal polarity or (ii) associated with the second phase with a flipped polarity in response to the phase angle satisfying a first one of the rules; or determining that the branch circuit current sensor is one of: (i) associated with the first phase with a flipped polarity or (ii) associated with the second phase with a normal polarity in response to the phase angle satisfying a second one of the rules, wherein the first one of the rules comprises the phase angle being within a first range or a second range and the second one of the rules comprises the phase angle being within a third range, wherein the first range is greater than or equal to 0° and less than 20°, wherein the second range is greater than 320° and less than 360°, and wherein the third range is greater than 140° and less than 200°.

6. A branch circuit meter module for a branch current monitoring system employing a 2-Phase Wye wiring configuration, wherein the branch current monitoring system has a first phase and a second phase, the branch circuit meter module comprising:

a control system, wherein the control system stores and is structured to execute a number of routines, the number of routines being structured to:

receive a voltage measurement from a voltage sensor associated with the first phase;

receive a current measurement from a branch circuit current sensor, wherein the branch circuit current sensor is intended to measure a phase current of the first phase;

determine a phase angle between the voltage measurement and the current measurement; and use the phase angle and a set of rules including a plurality of predetermined rules to identify at least one phase association and at least one polarity for the branch circuit current sensor, wherein the routines are structured to use the phase angle and the set of rules by:

determining that the branch circuit current sensor is one of: (i) associated with the first phase with a normal polarity or (ii) associated with the second phase with a flipped polarity in response to the phase angle satisfying a first one of the rules; or determining that the branch circuit current sensor is one of: (i) associated with the first phase with a flipped polarity or (ii) associated with the second phase with a normal polarity in response to the phase angle satisfying a second one of the rules, wherein the first one of the rules comprises the phase angle being within a first range and the second one of the rules comprises the phase angle being within a second range, and wherein the first range is greater than 20° and less than 80°, and wherein the second range is greater than 200° and less than 260°.

7. A branch circuit meter module for a branch current monitoring system employing a Single-Phase 3-Wire wiring configuration, wherein the branch current monitoring system has a first phase and a second phase, the branch circuit meter module comprising:

a control system, wherein the control system stores and is structured to execute a number of routines, the number of routines being structured to:

receive a voltage measurement from a voltage sensor associated with the first phase;

receive a current measurement from a branch circuit current sensor, wherein the branch circuit current sensor is intended to measure a phase current of the first phase;

determine a phase angle between the voltage measurement and the current measurement; and use the phase angle and a set of rules including a plurality of predetermined rules to identify at least one phase association and at least one polarity for the branch circuit current sensor, wherein the routines are structured to use the phase angle and the set of rules by:

determining that the branch circuit current sensor is one of: (i) associated with the first phase with a normal polarity or (ii) associated with the second phase with a flipped polarity in response to the phase angle satisfying a first one of the rules; or determining that the branch circuit current sensor is one of: (i) associated with the first phase with a flipped polarity or (ii) associated with the second phase with a normal polarity in response to the phase angle satisfying a second one of the rules, wherein the first one of the rules comprises the phase angle being within a first range or a second range and the second one of the rules comprises the phase angle being within a third range, and wherein the first range is greater than or equal to 0° and less than 50°, wherein the second range is greater than 350° and less than 360°, and wherein the third range is greater than 170° and less than 230°.

8. A branch circuit meter module for a branch current monitoring system employing a Single-Phase 2-Wire wiring configuration, wherein the branch current monitoring system has a first phase, the branch circuit meter module comprising:

a control system, wherein the control system stores and is structured to execute a number of routines, the number of routines being structured to:

receive a voltage measurement from a voltage sensor associated with the first phase;
receive a current measurement from a branch circuit current sensor, wherein the branch circuit current sensor is intended to measure a phase current of the first phase;
determine a phase angle between the voltage measurement and the current measurement; and
use the phase angle and a set of rules including a plurality of predetermined rules to identify at least one phase association and at least one polarity for the branch circuit current sensor, wherein the routines are structured to use the phase angle and the set of rules by:

determining that the branch circuit current sensor is associated with the first phase with a normal polarity in response to the phase angle satisfying a first one of the rules, wherein the first one of the rules comprises the phase angle being within a first range, and wherein the first range is greater than or equal to 0° and less than 50°; or
determining that the branch circuit current sensor is associated with the first phase with a flipped polarity in response to the phase angle satisfying a second one of the rules, wherein the second one of the rules comprises the phase angle being within a second range, and wherein the second range is greater than or equal to 170° and less than 230°.

9. A non-transitory computer readable medium storing one or more programs, including instructions, which when executed by a computer, causes the computer to perform the method of claim 1.

10. A non-transitory computer readable medium storing one or more programs, including instructions, which when executed by a computer, causes the computer to perform the method of claim 2.

11. A non-transitory computer readable medium storing one or more programs, including instructions, which when executed by a computer, causes the computer to perform the method of claim 3.

12. A non-transitory computer readable medium storing one or more programs, including instructions, which when executed by a computer, causes the computer to perform the method of claim 4.

* * * * *